United States Patent
Iguchi et al.

(10) Patent No.: US 11,393,963 B2
(45) Date of Patent: Jul. 19, 2022

(54) LED UNIT, IMAGE DISPLAY ELEMENT, AND METHOD OF MANUFACTURING THE SAME

(71) Applicant: SHARP KABUSHIKI KAISHA, Osaka (JP)

(72) Inventors: Katsuji Iguchi, Osaka (JP); Masumi Maegawa, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 162 days.

(21) Appl. No.: 16/646,992

(22) PCT Filed: Mar. 7, 2018

(86) PCT No.: PCT/JP2018/008807
§ 371 (c)(1),
(2) Date: Mar. 12, 2020

(87) PCT Pub. No.: WO2019/053923
PCT Pub. Date: Mar. 21, 2019

(65) Prior Publication Data
US 2020/0259055 A1      Aug. 13, 2020

(30) Foreign Application Priority Data
Sep. 13, 2017 (JP) .............................. JP2017-175996

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 33/32* (2013.01); *H01L 33/382* (2013.01)

(58) Field of Classification Search
CPC combination set(s) only.
See application file for complete search history.

(56) References Cited

U.S. PATENT DOCUMENTS

| 2009/0278142 A1 | 11/2009 | Watanabe et al. |
| 2014/0124730 A1 | 5/2014 | Choi et al. |
| (Continued) | | |

FOREIGN PATENT DOCUMENTS

| JP | 2006-190851 A | 7/2006 |
| JP | 2009-272591 A | 11/2009 |
| (Continued) | | |

OTHER PUBLICATIONS

Francois Olivier et al., "Investigation and Improvement of 10μm Pixel-pitch GaN-based Micro-LED Arrays with Very High Brightness", SID 2017 DIGEST, pp. 353-356.

*Primary Examiner* — Ratisha Mehta
(74) *Attorney, Agent, or Firm* — ScienBiziP, P.C.

(57) ABSTRACT

An N electrode and a P electrode formed on the same surface are respectively bonded to a cathode electrode and an anode electrode of a drive circuit board through a connection step performed once. An LED unit includes a first wiring (21) that is disposed inside a groove formed in a nitride semiconductor (13) to penetrate between an N-type layer (10) and a P-type layer (12) and is electrically connected to the N-type layer (10), and a second wiring that includes a P electrode (30) connected to the P-type layer (12) and an N electrode (31) connected to the first wiring (21), in which the N electrode (31) and the P electrode (30) are formed on the same surface.

20 Claims, 21 Drawing Sheets

(51) Int. Cl.
*H01L 33/32* (2010.01)
*H01L 33/38* (2010.01)

(56) References Cited

U.S. PATENT DOCUMENTS

| | | |
|---|---|---|
| 2014/0159043 A1 | 6/2014 | Sakariya et al. |
| 2014/0159064 A1 | 6/2014 | Sakariya et al. |
| 2014/0159067 A1 | 6/2014 | Sakariya et al. |
| 2015/0179703 A1 | 6/2015 | Sakariya et al. |
| 2015/0380461 A1 | 12/2015 | Robin et al. |
| 2016/0013167 A1 | 1/2016 | Sakariya et al. |
| 2016/0013170 A1 | 1/2016 | Sakariya et al. |
| 2016/0056204 A1 | 2/2016 | Sakariya et al. |
| 2017/0148773 A1 | 5/2017 | Sakariya et al. |
| 2018/0374831 A1 | 12/2018 | Sakariya et al. |

FOREIGN PATENT DOCUMENTS

| | | |
|---|---|---|
| JP | 2001-326388 A | 11/2011 |
| JP | 2014-093532 A | 5/2014 |
| JP | 2016-027637 A | 2/2016 |
| JP | 2016-503958 A | 2/2016 |

1: PIXEL REGION
2: COMMON CONNECTION REGION
3: DIVISION REGION
13: NITRIDE SEMICONDUCTOR
15: P CONTACT FILM
18: INSULATING FILM SIDEWALL
21: FIRST WIRING
24: VIA HOLE
30: P ELECTRODE
31: N ELECTRODE
100: MICRO-LED CHIP
200: MICRO-LED UNIT

FIG. 4
(a)
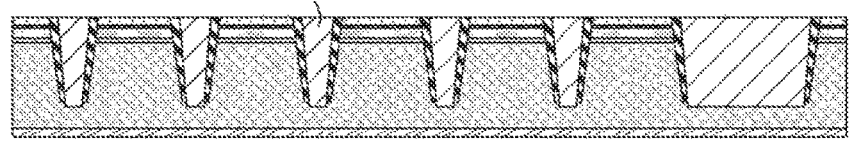
21: FIRST WIRING
(b)
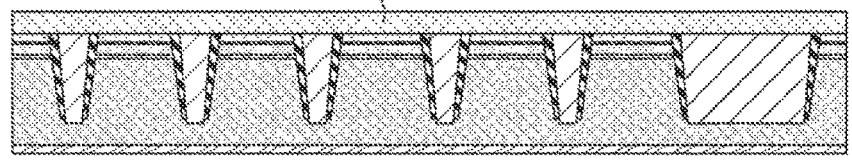
22: INTERLAYER INSULATING FILM
(c)
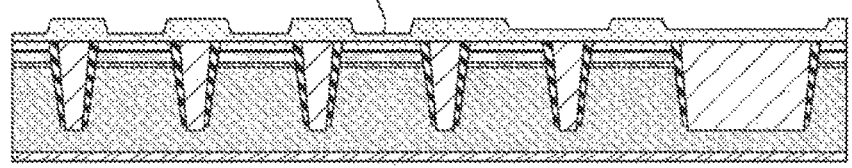
23: SECOND WIRING GROOVE
(d)
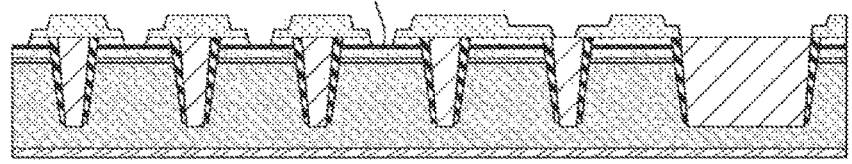
24: VIA HOLE
(e)
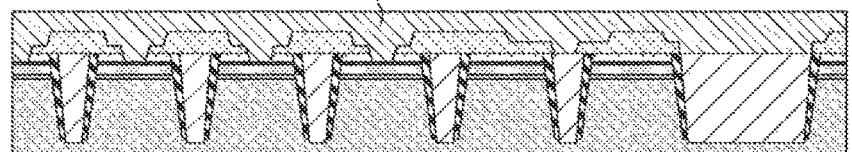
25: SECOND WIRING MATERIAL FIG. 5
(a)
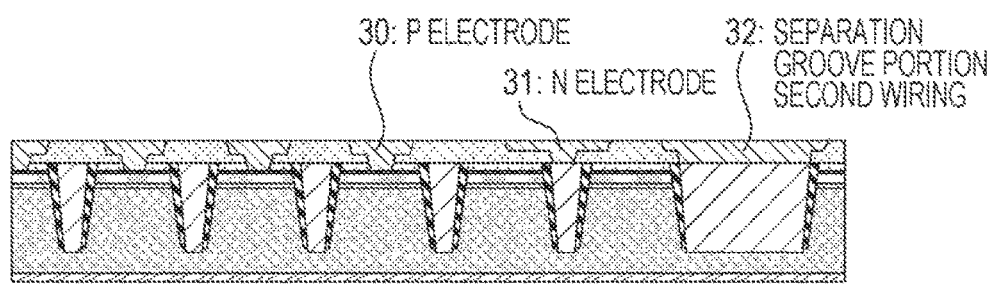
(b)
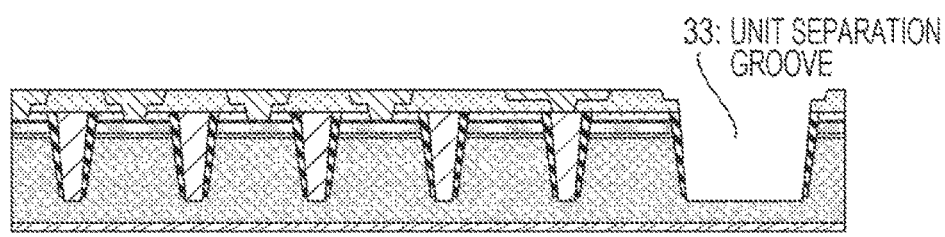
(c)
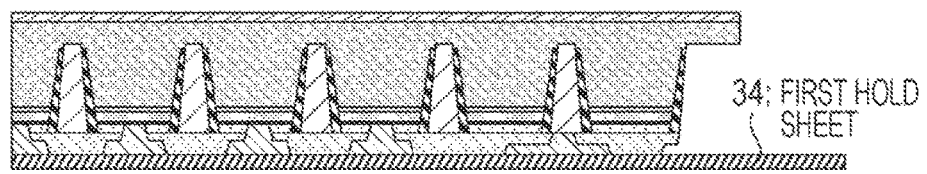
(d)
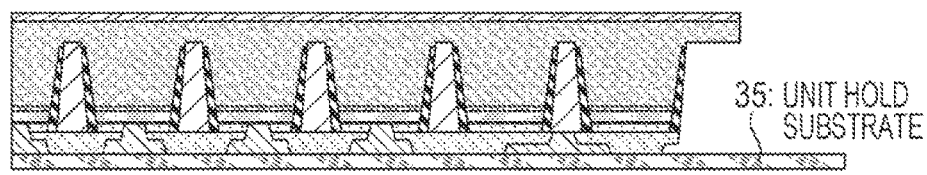

FIG. 6
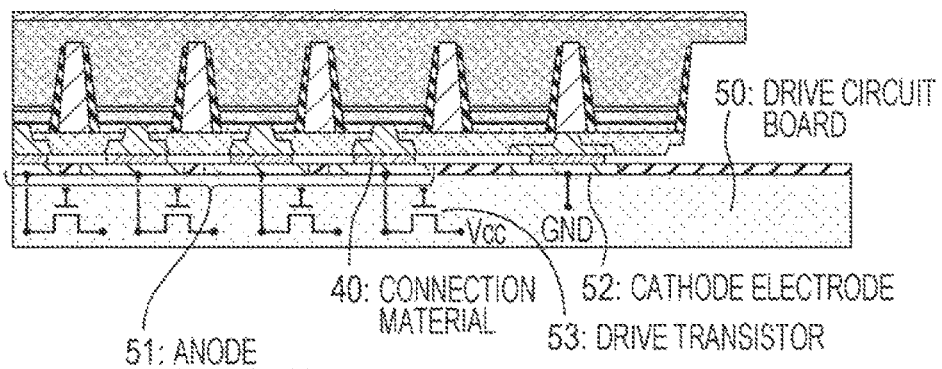
(a)
50: DRIVE CIRCUIT BOARD
40: CONNECTION MATERIAL
52: CATHODE ELECTRODE
53: DRIVE TRANSISTOR
51: ANODE ELECTRODE
(b)
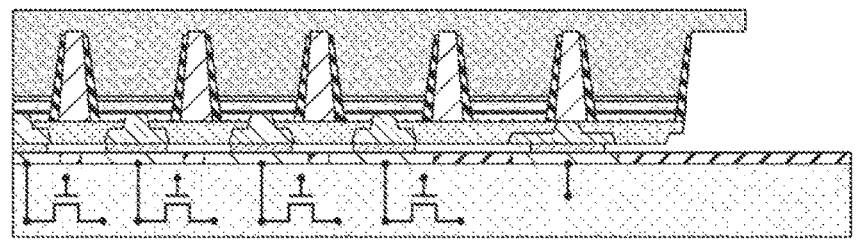

FIG. 7
(a)
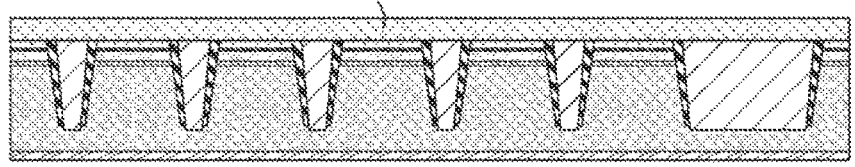
(b)
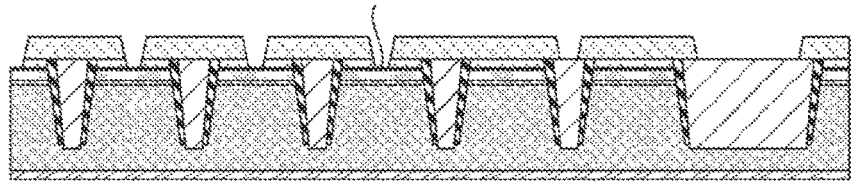
(c)
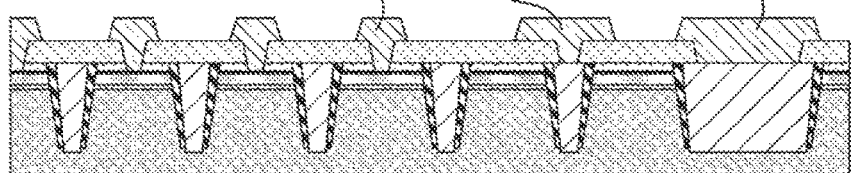
(d)
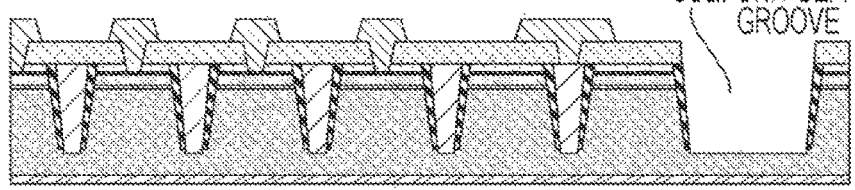
(e)
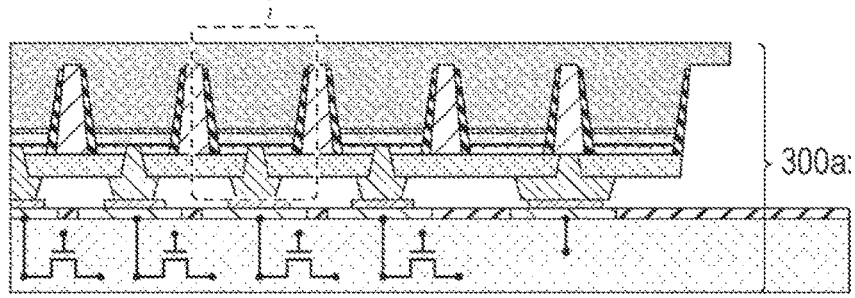

1: PIXEL REGION
2b: COMMON CONNECTION REGION
3: DIVISION REGION
13: NITRIDE SEMICONDUCTOR
15: P CONTACT FILM
18: INSULATING FILM SIDEWALL
21b: FIRST WIRING
24b: VIA HOLE
30: P ELECTRODE
31b: N ELECTRODE
100: MICRO-LED CHIP
200b: MICRO-LED UNIT

FIG. 16
(a)
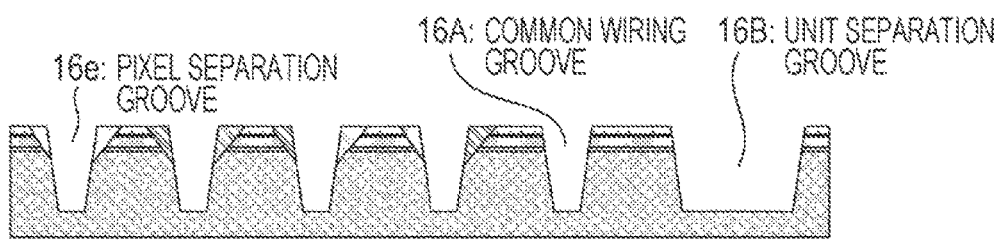
(b)
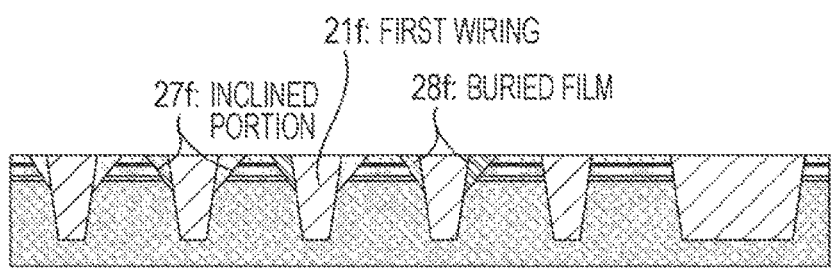
(c)
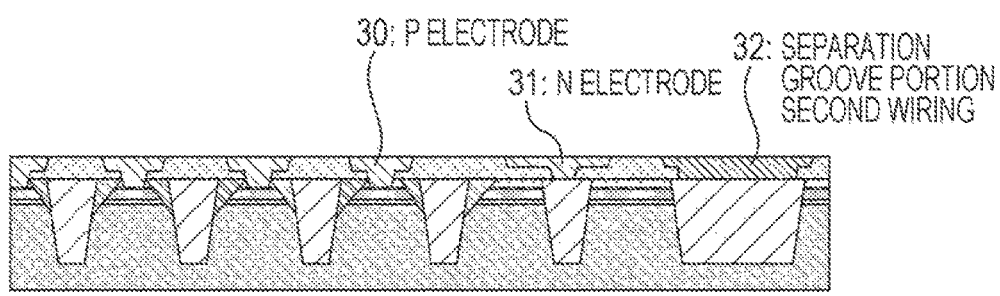
(d)
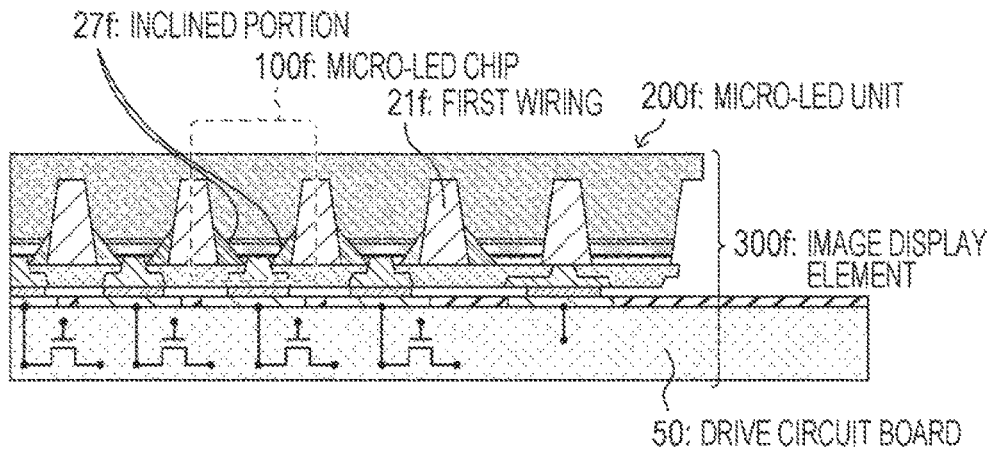

1: PIXEL REGION
2g: N CONNECTION REGION
3: DIVISION REGION
13: NITRIDE SEMICONDUCTOR
15: P CONTACT FILM
18: INSULATING FILM SIDEWALL
21g: FIRST WIRING

24g: VIA HOLE
30g: P ELECTRODE
31g: N ELECTRODE
100g: MICRO-LED CHIP
200g: MICRO-LED UNIT

1: PIXEL REGION
2: COMMON CONNECTION REGION
3: DIVISION REGION
13: NITRIDE SEMICONDUCTOR
15: P CONTACT FILM
18h: INSULATING FILM SIDEWALL
21h: FIRST WIRING
24: VIA HOLE
30h: P ELECTRODE
31h: N ELECTRODE
100h: MICRO-LED CHIP
200h: MICRO-LED UNIT

FIG. 21
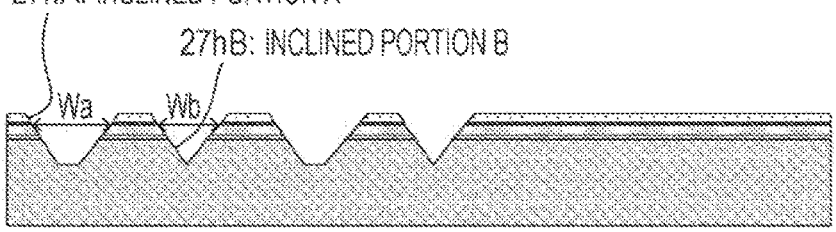
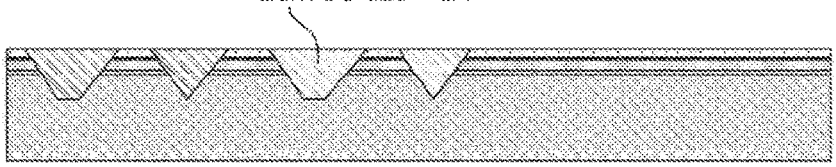
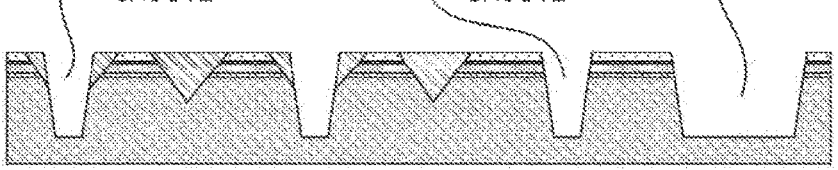
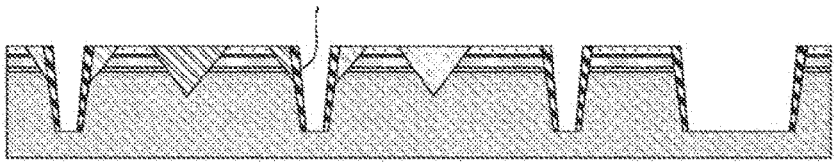
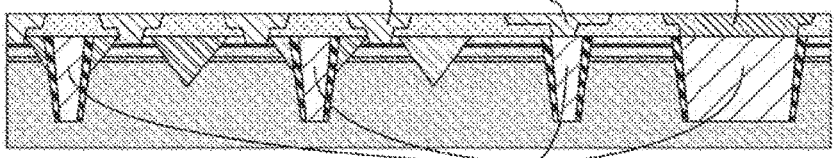

LED UNIT, IMAGE DISPLAY ELEMENT, AND METHOD OF MANUFACTURING THE SAME

TECHNICAL FIELD

The present invention relates to an LED unit, an image display element, and a method of manufacturing the image display element.

BACKGROUND ART

In a technical field of a flat display, a liquid crystal display element is widely used from large one to small or medium sized ones. The luminance of each pixel is adjusted by turning on and off backlight light with a liquid crystal display element, but it is difficult for the liquid crystal display element to block light completely, and thus there is a limitation in contrast. Respective colors such as red (R), green (G), and blue (B) are expressed by using color filters, and thus transmission bands of the color filters of R, G, and B cannot be completely separated from each other such that there is also a limitation in the color rendering properties.

On the other hand, each single-color light emitting element of R, G, and B as a self-light emitting element is disposed in an organic electroluminescence (EL) display, and thus it is expected that the problems such as contrast and color rendering properties in the liquid crystal display can be solved. Actually, the organic EL display is of practical use in a small-sized display element for a smart phone.

However, since the organic EL display has a light emitting layer made of an organic substance, luminance tends to deteriorate over time, and the organic EL display is used in a smart phone of which a product life cycle is relatively short but is hardly applied to a product that is used for a long period. In a case of long-period use, a complex circuit is necessary to compensate for deterioration over time.

As a technique for solving the problems in a liquid crystal display or an organic EL display, a flat display has been proposed in which LED chips made of nitride semiconductor are arranged in a two-dimensional array form and thus luminance and contrast are high and color rendering properties are also excellent (refer to PTLs 1 and 2).

Particularly, a display in which LED chips are arranged in a two-dimensional array form has high light emission efficiency and high long-term reliability compared with an organic EL display, and can thus realize a high-luminance display that is easy to view even outdoors. A super large-sized liquid crystal display element has started to be put to practical use for a digital signage, and has been developed for use in a wearable terminal or a TV set.

Such an LED chip is also called a micro-LED chip, miniaturization thereof has been examined, and an object with a size of about 7 μm has been presented at a conference (refer to NPL 1).

CITATION LIST

Patent Literature

PTL 1: Japanese Unexamined Patent Application Publication No. 2009-272591 (published on Nov. 19, 2009)
PTL 2: Japanese Unexamined Patent Application Publication (Translation of PCT Application) No. 2016-503958 (published on Feb. 8, 2016)

Non Patent Literature

NPL 1: Francois Olivier, Anis Daami, Ludovic Dupre, Franck Henry, Bernard Aventurier, Francois Templier, "Investigation and Improvement of 10 μm Pixel-pitch GaN-based Micro-LED Arrays with Very High Brightness", SID 2017 DIGEST, P353

SUMMARY OF INVENTION

Technical Problem

However, there are the following problems in producing a micro-LED chip according to the structure and the method disclosed in PTLs 1 and 2 and NPL 1.

First, it is necessary that a group (micro-LED unit) of the micro-LED chips is divided in the display element unit and is bonded to and electrically connected to a drive circuit board such that a current can be supplied to each micro-LED chip. During connection, a P-type electrode of the micro-LED chip may be connected to a corresponding anode electrode on the drive circuit board for each pixel, but a problem is how an N-type electrode of the micro-LED chip is connected to a cathode electrode on the drive circuit board without additional steps. NPL 1 does not disclose this point. In steps from dividing units to bonding the unit to the drive circuit board, a production technology achieving a high yield by preventing the occurrence of a defect is necessary.

In the structure disclosed in NPL 1, since an N-type GaN layer is not separated for each pixel, light generated from a certain pixel leaks to adjacent pixels via the N-type GaN layer, and thus there is a problem in that contrast is reduced, or the color rendering properties deteriorates due to color mixing.

As disclosed in NPL 1, in a case where a micro-LED chip is made small, external quantum efficiency (a ratio of light emission power to supplied power) is considerably reduced. In an LED having a normal size, the external quantum efficiency is about 30% to 60%, but, in a case where a size of an LED chip is 10 μm, the external quantum efficiency is less than 11%. Thus, the external quantum efficiency is significantly lower than that in the LED having a normal size. A display using the micro-LED chip is expected to have high light emission efficiency, and thus such low external quantum efficiency is a considerably serious problem.

One aspect of the present invention has been made in light of the problems, and an object thereof is to realize an LED unit or the like of which an N electrode and a P electrode can be respectively connected to a cathode electrode and an anode electrode of a drive circuit board by joining the LED unit to the drive circuit board by using a simple method.

Solution to Problem

In order to solve the problem, an LED unit related to one aspect of the present invention includes a plurality of LED chips each having a nitride semiconductor in which an N-type layer, a light emitting layer, and a P-type layer are laminated in this order in a pixel region; a first wiring that is disposed inside a groove formed in the nitride semiconductor to penetrate between the N-type layer and the P-type layer and is electrically connected to the N-type layer; and a second wiring that includes a P electrode connected to the P-type layer and an N electrode connected to the first wiring, in which the N electrode and the P electrode are formed on the same surface.

Advantageous Effects of Invention

According to the LED unit related to one aspect of the present invention, the N electrode and the P electrode are formed on the same surface, and thus it is possible to achieve an effect that the N electrode and the P electrode are respectively bonded to the cathode electrode and the anode electrode of the drive circuit board simultaneously through one connection step.

BRIEF DESCRIPTION OF DRAWINGS

FIG. 4 is a schematic sectional view illustrating a subsequent step of manufacturing the LED unit and the image display element.

FIG. 5 is a schematic sectional view illustrating a subsequent step of manufacturing the LED unit and the image display element.

FIG. 6 is a schematic sectional view illustrating a subsequent step of manufacturing the LED unit and the image display element.

FIG. 7 is a schematic sectional view illustrating a step of manufacturing an LED chip according to a first modification example of the first embodiment of the present invention.

FIG. 16 is a schematic sectional view illustrating a step of manufacturing an LED unit and an image display element according to a modification example of the fourth embodiment of the present invention.

FIG. 21 is a schematic sectional view illustrating a step of manufacturing the LED unit and the image display element according to the sixth embodiment of the present invention.

DESCRIPTION OF EMBODIMENTS

Figure 1:
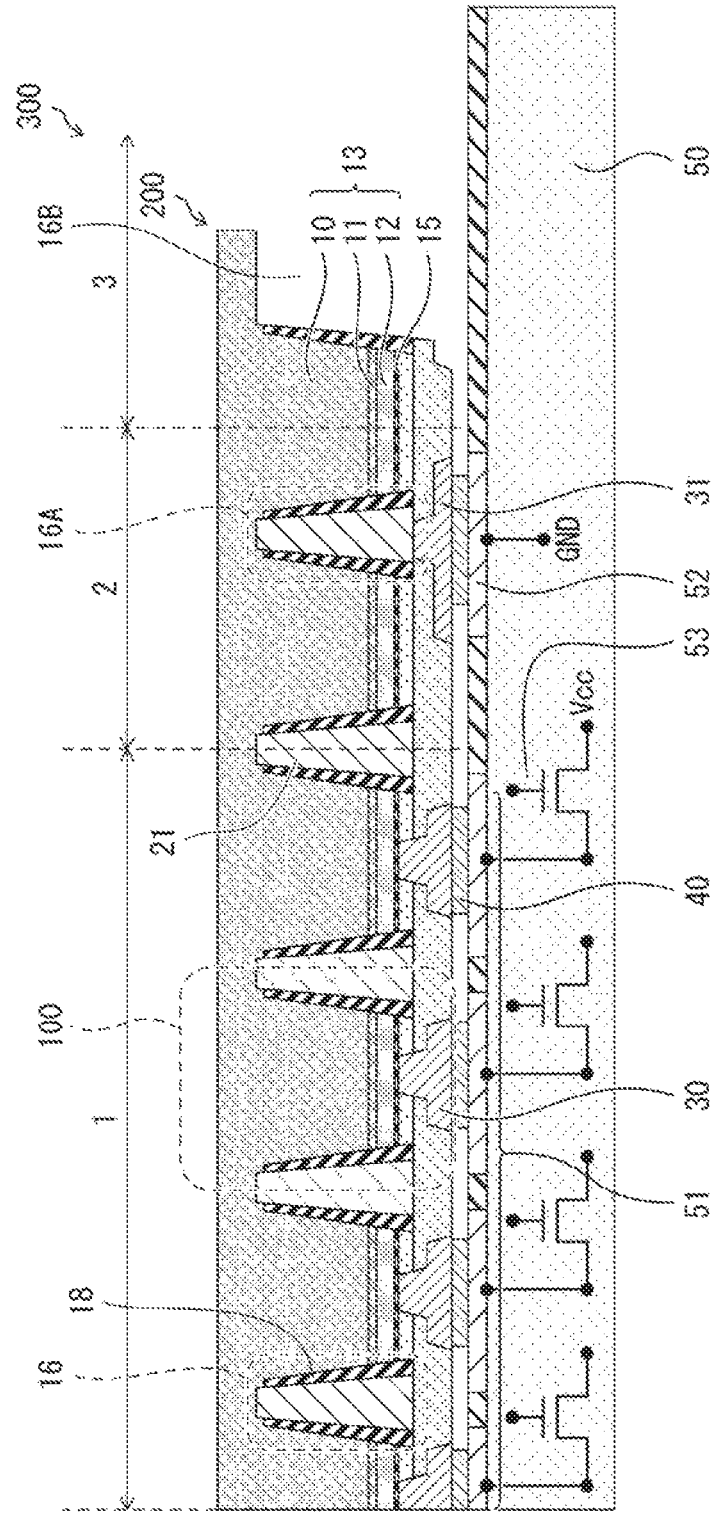
FIG. 1 is a schematic sectional view illustrating a structure of an image display element according to a first embodiment of the present invention.

Hereinafter, with respect to the drawings, embodiments of the present invention will be described by exemplifying an image display element 300 on which a micro-LED unit (LED unit) 200 formed of an aggregate of a plurality of micro-LED chips (LED chips) 100 is mounted as a light source. The image display element 300 has a plurality of micro-LED chips 100 in a pixel region 1, and has a drive circuit board 50 that supplies a current to the micro-LED chip 100 to emit light, and the light emitted from the micro-LED chip 100 is emitted to an opposite side to the drive circuit board 50. A wavelength conversion layer, a light diffusion layer, or a color filter may be provided on a light emission side, but does not have direct relation to the present invention and thus is not illustrated.

First Embodiment

As illustrated in FIG. 1, the image display element 300 includes the micro-LED unit 200 forming a light emitting portion, and the drive circuit board 50 that supplies a current to the micro-LED unit 200. The micro-LED unit 200 includes the pixel region 1 in which a plurality of micro-LED chips 100 forming pixels are disposed, a common connection region 2 in which an N-type layer 10 of the micro-LED chip 100 is connected to a cathode electrode 52 of the drive circuit board 50, and a division region 3 used to sever the individual micro-LED units 200.

A P electrode 30 connected to a P-type layer 12 is disposed in each micro-LED chip 100, and is connected to an anode electrode 51 on the drive circuit board 50. The N-type layer 10 of the micro-LED chip 100 is connected to an N electrode 31 via a first wiring 21, and the N electrode 31 is connected to the cathode electrode 52. A circuit causing a predetermined current to flow to each pixel is formed inside the drive circuit board 50, and thus a predetermined current can be caused to flow to each micro-LED chip 100 via the anode electrode 51 and the cathode electrode 52.

Figure 2:
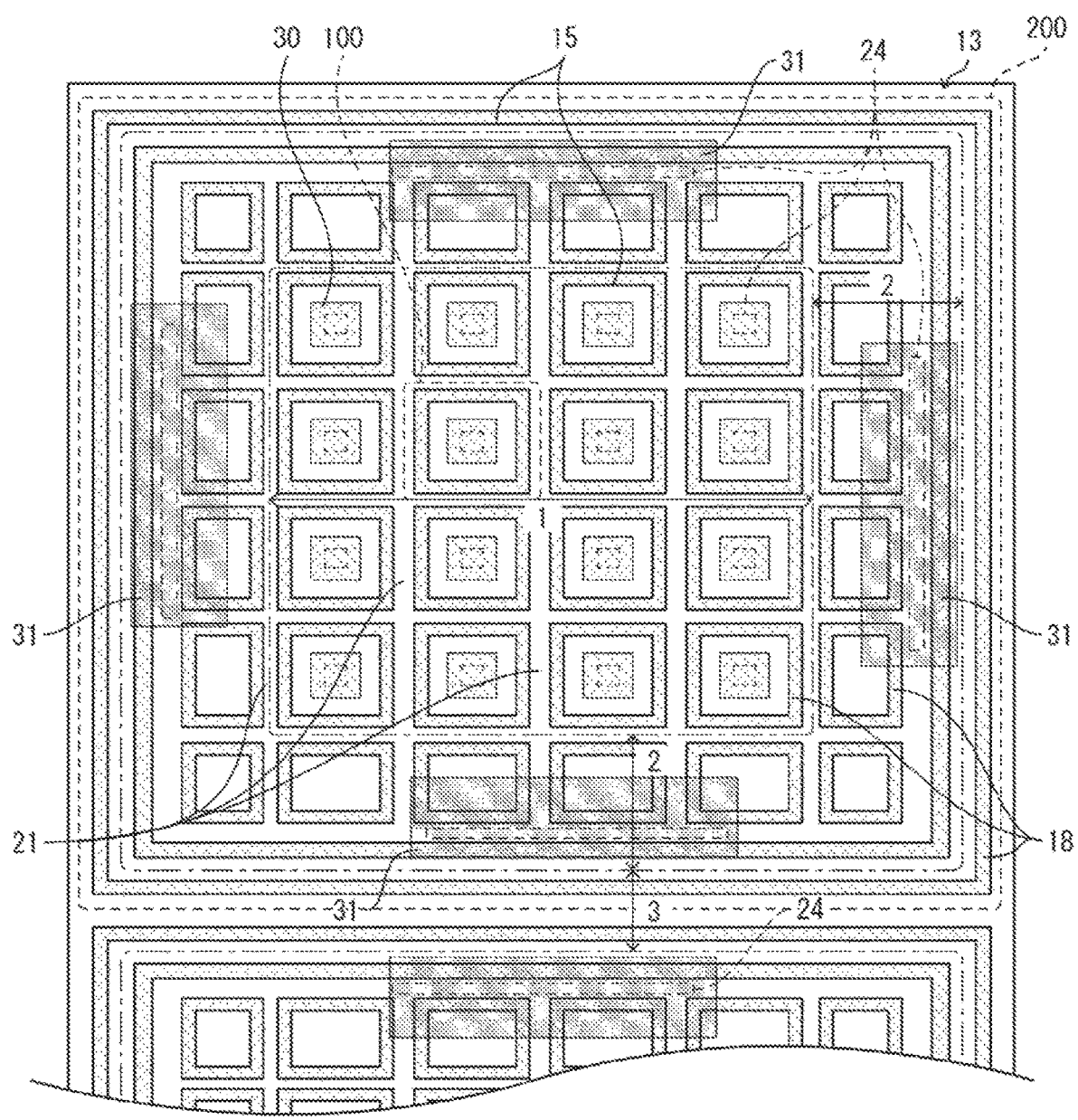
FIG. 2 is a schematic plan view in which an LED unit according to the first embodiment of the present invention is viewed from a light emission side.

As illustrated in FIG. 2, the micro-LED chips 100 are disposed in an array form in a central part of the micro-LED unit 200, and the common connection region 2 is disposed in an outer peripheral part thereof. In the present embodiment, the N electrode 31 is disposed in the common connection region 2 provided between the pixel region 1 and the division region 3.

In FIG. 2, the common connection region 2 is disposed in all directions of the pixel region 1. The N electrodes 31 are disposed along four sides of the pixel region 1 having a substantially rectangular shape. This is so that the uniformity of luminance is improved and power consumption is reduced by reducing a variation in luminance due to resistance of a wiring from the N electrode 31 to the micro-LED chip 100 in the pixel region 1. However, in a case where resistance of the first wiring 21 is sufficiently low, the N electrodes are not necessarily disposed in all directions, and may be provided to be adjacent to at least one side of the pixel region 1.

There is a case where a dummy chip having the same shape and not emitting light is disposed on the periphery of the micro-LED chip 100 that actually emits light in order to correct a proximity effect during fine processing, but a dummy chip is omitted in the present embodiment. In a case where a dummy chip is added, the dummy chip is disposed between the pixel region 1 and the common connection region 2 in FIG. 1 or 2. The first wiring 21 is also disposed in the dummy chip in the same manner as in the micro-LED chip 100, and is connected up to the common connection region 2.

The micro-LED unit 200 has a nitride semiconductor 13 including the N-type layer 10, a light emitting layer 11, and the P-type layer 12. In the nitride semiconductor 13, the N-type layer 10, the light emitting layer 11, and the P-type layer 12 are laminated in this order. A pixel separation groove (groove) 16 that separates the respective micro-LED chips 100 from each other is formed in the nitride semiconductor 13. The pixel separation groove 16 penetrates through at least the P-type layer 12 and the light emitting layer 11 and reaches the N-type layer 10. The pixel separation groove 16 is a groove formed in the nitride semiconductor 13 so as to penetrate between the N-type layer 10 and the P-type layer 12. A sidewall of the pixel separation groove 16 is formed as an insulating film sidewall 18, and thus prevents the N-type layer 10 from being short-circuited to the P-type layer 12 due to the first wiring 21. The first wiring 21 is disposed inside the pixel separation groove 16, and is disposed in a lattice form. The first wiring 21 is electrically connected to the N-type layer 10 at a bottom of the pixel separation groove 16.

A common wiring groove 16A similar to the pixel separation groove 16 is formed in the common connection region 2, and the first wiring 21 formed in the common wiring groove 16A is connected to the N electrode 31. A second wiring that is different from the first wiring 21 is provided, and the second wiring is present as the P electrode 30 connected to the P-type layer 12 of the micro-LED chip 100 and the N electrode 31 connected to the first wiring 21. The P electrode 30 and the N electrode 31 are formed at the same height above a surface (a surface formed by the P-type layer 12) of the nitride semiconductor 13. In other words, the N electrode 31 and the P electrode 30 are formed on the surface of the nitride semiconductor 13 facing a surface of the drive circuit board 50 on which the cathode electrode 52 and the anode electrode 51 are provided.

Thus, the N electrode 31 and the P electrode 30 can be respectively connected to the cathode electrode 52 and the anode electrode 51 of the drive circuit board 50 through bonding on the drive circuit board 50 by a simple method. In other words, as illustrated in FIG. 1, the N electrode 31 and the P electrode 30 can be connected to the drive circuit board 50 by the same connection method for both of the two.

The outermost periphery of the micro-LED unit 200 is partitioned by a unit separation groove 16B. More specifically, the division region 3 used to sever the micro-LED unit 200 from other LED units is provided in the outer periphery of the micro-LED unit 200. The unit separation groove 16B used to separate the LED unit from other LED units is formed in the division region 3, and the first wiring 21 is not present inside the unit separation groove 16B. The first wiring 21 and the second wiring are not present in the division region 3.

The micro-LED units 200 are divided into individual pieces after the nitride semiconductor 13 is formed on a growth substrate 9, and the micro-LED chips 100 and the like are processed. The unit separation groove 16B is formed to prevent an edge of the micro-LED unit 200 from being split in an irregular shape when each micro-LED unit 200 is divided into individual piece and to suppress the occurrence of defects in a bonding step to the drive circuit board 50 or in the subsequent manufacturing processes. A first wiring material 20 is preferably removed from the unit separation groove 16B unlike the pixel separation groove 16 or the common wiring groove 16A. In a case where the first wiring material 20 remains, a problem occurs in which the first wiring material 20 scatters to increase dust and thus a defect increases in a step of dividing the micro-LED units 200 or a step of bonding to the drive circuit board 50.

Next, with reference to FIGS. 3 to 6, a description will be made of steps of manufacturing the micro-LED chip 100. As illustrated in (a) of FIG. 3, the nitride semiconductor 13 such as GaN is grown on the growth substrate 9 made of sapphire, SiC, or Si, by using an MOCVD equipment. First, the N-type layer 10 is grown, then the light emitting layer 11 is grown, and then the P-type layer 12 is further grown. The growth substrate 9 may have a textured structure in its surface. The light emitting layer 11 includes a multiple-quantum well layer formed of an InGaN layer or a GaN layer. Each of the N-type layer 10 and the P-type layer 12 is formed of a complex multilayer structure but has no relation to the present invention, and thus a detailed description thereof will not be made.

A thickness Tn of the N-type layer 10 is generally 10 μm or less, and is particularly preferably 3 μm or more and 7 μm or less. A thickness Tmqw of the light emitting layer 11 is generally 10 nm or more and 200 nm or less, and is particularly preferably 50 nm or more and 100 nm or less. A thickness Tp of the P-type layer 12 is generally 50 nm or more and 1000 nm or less, and is particularly preferably 100 nm or more and 300 nm or less.

After growth of the nitride semiconductor 13 formed of the N-type layer 10, the light emitting layer 11, and the P-type layer 12 is completed, a P contact film (contact layer) 15 and a protection film 14 are formed. The P contact film 15 is formed in contact with the P-type layer 12. The P contact film 15 is preferably made of a material having low contact resistance with the P-type layer 12 and high light reflectance at an interface with the nitride semiconductor 13. Specifically, a transparent conductive film such as ITO or IZO, or a metal electrode such as Al or Ag is preferably used. A film thickness of the P contact film 15 is preferably 10 nm or more and 500 nm or less. The protection film 14 is preferably an insulating film such as $SiO_2$, SiN, SiON, and a thickness thereof is preferably 50 nm or more and 500 nm or less.

Figure 3:
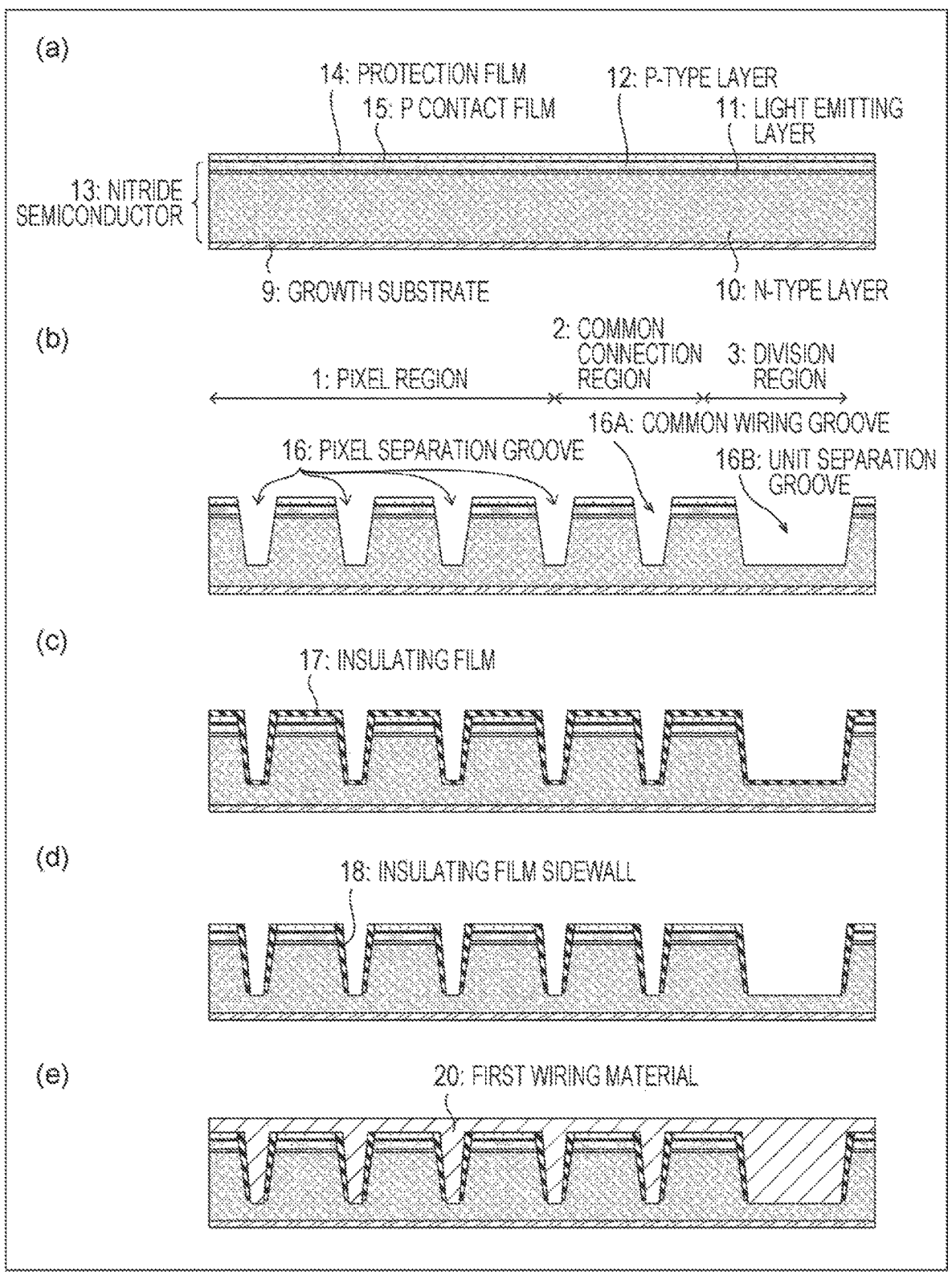
FIG. 3 is a schematic sectional view illustrating a step of manufacturing the LED unit and the image display element.

Next, as illustrated in (b) of FIG. 3, in the pixel region 1, the pixel separation groove 16 is formed in an outer peripheral part of the micro-LED chip 100. Simultaneously, the common wiring groove 16A is formed in the common connection region 2, and the unit separation groove 16B is formed in the division region 3. The grooves are formed by forming a resist pattern having openings corresponding to the pixel separation groove 16, the common wiring groove 16A, and the unit separation groove 16B by an ordinary photolithography step, and by etching parts of the protection film 14, the P contact film 15, the P-type layer 12, the light emitting layer 11, and the N-type layer 10 by using a dry etching equipment. During the etching, the etching is required to be performed such that inclinations of sidewalls of the pixel separation groove 16 and the common wiring groove 16A are not too large. In a case where an inclination is large, it is difficult to form the insulating film sidewall 18 that will be subsequently formed, and a groove width for securing a predetermined depth of a groove increases such that an area of the light emitting layer 11 of the micro-LED chip 100 is reduced, and thus light emission efficiency is reduced. In a case where an angle formed between the groove sidewall and a surface of the nitride semiconductor 13 is indicated by θ, at least θ>70 degrees is preferable, and θ>80 degrees is more preferable. At least one common wiring groove 16A is required to be provided in the common connection region 2, and a plurality of common wiring grooves may be provided. A groove width of the common wiring groove 16A is preferably equal to or larger than a groove width of the pixel separation groove 16. The unit separation groove 16B provided in the division region 3 is wider than the pixel separation groove 16 and the common wiring groove 16A, and a width thereof is preferably 10 μm or more and 30 μm or less.

Next, as illustrated in (c) of FIG. 3, an insulating film 17 is deposited. The insulating film 17 is preferably deposited as uniformly as possible even in the groove inside, and is more preferably formed by a CVD method. The insulating film 17 is a single-layer film such as $SiO_2$, SiN, or SiON, or a laminate film of a plurality of layers. A thickness of the entire insulating film 17 is preferably 50 nm or more and 1000 nm or less.

Next, as illustrated in (d) of FIG. 3, the insulating film 17 is etched back, and thus the insulating film sidewall 18 is formed on sidewalls of the pixel separation groove 16, the common wiring groove 16A, and the unit separation groove 16B. In this case, the insulating film 17 is required not to remain on bottoms of the pixel separation groove 16 and the common wiring groove 16A.

Next, as illustrated in (e) of FIG. 3, the first wiring material 20 is deposited. For example, the first wiring material 20 is a multilayer metal film that is formed by forming a copper seed layer on a contact barrier layer made of Ta or TaN through sputtering and then plating copper thereon. Alternatively, the first wiring material may be an aluminum alloy formed by a reflow sputtering method, and may have a contact barrier layer made of Ti or TiN.

Next, as illustrated in (a) of FIG. 4, a surface of the first wiring material 20 is polished and removed through chemical mechanical polishing (CMP), and thus the first wiring material 20 remains only inside the pixel separation groove 16, the common wiring groove 16A, the unit separation groove 16B. Consequently, the first wiring 21 is formed.

Next, as illustrated in (b) of FIG. 4, an interlayer insulating film 22 is formed on the entire surface that has been polished and removed through the CMP. The interlayer insulating film 22 is a single-layer film such as $SiO_2$, SiN, SiON, or SiOCN, or a laminate film of a plurality of layers. A thickness of the entire interlayer insulating film 22 is preferably 200 nm or more and 1000 nm or less.

Next, as illustrated in (c) of FIG. 4, a second wiring groove 23 is formed. The second wiring groove 23 corresponds to the P electrode 30 of the micro-LED 100 in the pixel region 1, and corresponds to the N electrode 31 in the common connection region 2. In the division region 3, the second wiring groove 23 preferably covers the whole of the unit separation groove 16B.

Next, as illustrated in (d) of FIG. 4, a via hole 24 is formed. The via hole 24 connects the P electrode 30 of the micro-LED 100 to the P-type layer 12 in the pixel region 1 through the P contact film 15, and connects the N electrode 31 to the first wiring 21 in the common connection region 2. In the division region 3, the via hole 24 is preferably as wide as possible in a range of being smaller than a width of the second wiring groove 23.

Next, as illustrated in (e) of FIG. 4, a second wiring material 25 is deposited on the entire surface on which the second wiring groove 23 and the via hole 24 have been formed. Next, as illustrated in (a) of FIG. 5, the second wiring material 25 on the surface is removed through polishing and removal using CMP, and thus the second wiring material 25 remains only inside the second wiring groove 23 and the via hole 24. Consequently, the P electrode 30 of the micro-LED 100 is formed in the pixel region 1, and the N electrode 31 is formed in the common connection region 2. In the division region 3, a separation groove portion second wiring 32 is laminated to remain on the first wiring material 20 inside the unit separation groove 16B.

Next, as illustrated in (b) of FIG. 5, the first wiring material 20 and the separation groove portion second wiring 32 in the division region 3 are removed. Preferably, a resist pattern exposing only the division region 3 is formed, and the first wiring material 20 and the separation groove portion second wiring 32 are dissolved to be removed through wet etching. Consequently, a unit separation groove 33 is formed in an outer periphery of the micro-LED unit 200.

Next, a rear surface of the growth substrate 9 is polished to be thinned, and is then divided into the micro-LED units 200. After polishing, the surface side (the surface on which the electrodes are formed) is bonded to a first hold sheet 34 with the growth substrate 9, and each micro-LED unit 200 is divided by a laser scrub method. In this case, the first hold sheet 34 is expanded such that a space is formed between the adjacent micro-LED units 200, and thus the micro-LED units 200 can be individually picked up without interference therebetween (refer to (c) of FIG. 5).

Thereafter, the micro-LED unit 200 is transferred onto a unit hold substrate 35. Herein, (d) of FIG. 5 illustrates a case of a configuration in which the electrode side comes into contact with the unit hold substrate 35 after transfer is performed twice. This configuration has a feature that productivity is high since the micro-LED unit 200 can be handled in the same manner as in ordinary die bonding during bonding to the drive circuit board 50. After transfer is performed once, in a case where the growth substrate 9 side comes into contact with the unit hold substrate 35, the micro-LED unit 200 is required to be reversed during the bonding as in flip-chip bonding of the micro-LED unit 200.

Next, as illustrated in (a) of FIG. 6, connection materials 40 are provided on a surface of the drive circuit board 50, and the micro-LED unit 200 is bonded thereto. Here, the connection materials 40 may be conductive pastes printed on drive circuit side electrodes (the anode electrode 51 and the cathode electrode 52), and may be materials such as gold bumps that directly form alloys. In (a) of FIG. 6, the connection material 40 is separately disposed on each drive circuit electrode, but an anisotropic conductive film may be entirely disposed.

Alternatively, the drive circuit board 50 may be coated with a block copolymer (polystyrene-block-poly(2-vinylpyridine)) through spinning, to be immersed in an aqueous solution of $Na_2PdCl_4$, so that Pd ions are selectively precipitated in the core of 2-vinylpyridine of the block copolymer, and Pd nano-particles having a size of several tens of nm obtained by removing the polymer through plasma treatment may be precipitated at an interval of about 100 nm to 300 nm so as to be used as the connection material 40. This method is advantageous in that an expensive equipment is not necessary, and condition can be performed at a room temperature, and is thus considerably preferable. Finally, as illustrated in (b) of FIG. 6, the growth substrate 9 is peeled off by a laser liftoff method, and thus the image display element 300 is completed.

In the present embodiment, the first wiring 21 is provided inside the groove formed in the nitride semiconductor 13, and the first wiring 21 is connected to the N-type layer of the nitride semiconductor 13. In the pixel region 1, the first wiring 21 is disposed in a lattice form to surround the micro-LED chip 100 forming each pixel. On the other hand, at least first wiring 21 connected to the first wiring 21 of the pixel region 1 is disposed in the adjacent common connection region 2 outside the pixel region 1.

In the present embodiment, the second wiring is provided on the nitride semiconductor 13, and, in the pixel region 1, and the second wiring is connected to the P-type layer 12 of each micro-LED chip 100 via the P contact film 15, so as to form the P electrode 30. On the other hand, in the common connection region 2, the second wiring is connected to the first wiring 21 so as to form the N electrode 31 connected to the N-type layer 10 of the micro-LED chip 100. With the above-described configuration, in the micro-LED unit 200, the P electrode 30 and the N electrode 31 can be respectively connected to the anode electrode 51 and the cathode electrode 52 of the drive circuit board 50 simultaneously through the connection step performed once.

In the present embodiment, in the division region 3 outside the common connection region 2, the unit separation groove 33 is provided, and thus an irregular division shape that may occur when the micro-LED units 200 are divided from each other is prevented, and an increase in a defect due to generation of dust is prevented. Preferably, the unit separation groove 33 is not connected to the chip separation groove 16 or the common connection region 16A. This is so that adverse influence on the first wiring 21 of the pixel region 1 or the common connection region 2 is not exerted when the first wiring material 20 buried in the unit separation groove 33 is removed. In a case where the unit separation groove 33 is connected to the pixel separation groove 16 or the common wiring groove 16A, when a wiring in the unit separation groove 33 is dissolved to be removed through wet etching, there is a problem in that the etching progresses up to the pixel separation groove 16 or the common wiring groove 16A such that a necessary wiring material is removed.

In the present embodiment, a case where a multilayer metal film formed of a copper thin film was used as the first wiring material 20 was compared with a case where an aluminum alloy was used. A plane size of the light emitting layer 11 of the micro-LED chip 100 was 7 μm square, a pixel separation groove width was 3 μm, the thickness Tp of the P-type layer 12 was 100 nm, the thickness Tmqw of the light emitting layer 11 was 70 nm, the thickness Tn of the N-type layer 10 was 6500 nm, a depth D of the pixel separation groove 16 was 4200 nm (only the nitride semiconductor 13), and an average thickness of the insulating film sidewall 18 was 500 nm.

In a case where the multilayer metal film formed of a copper thin film was as the first wiring material 20, the external quantum efficiency of the single micro-LED chip 100 was 11%. On the other hand, in a case where the aluminum alloy was used as the first wiring material 20, the external quantum efficiency was improved to 13%. This may be because reflectance of light generated from the light emitting layer 11 at the sidewall of the pixel separation groove 16 was improved, and thus light extraction efficiency was improved. Therefore, in a wavelength bandwidth from blue-violet light to green light emitted from the nitride semiconductor 13, a material such as aluminum or silver having high reflectance at a nitride semiconductor/metal interface may be advantageous as the first wiring material 20 in increasing light emission efficiency of the micro-LED unit 200.

First Modification Example of First Embodiment

FIG. 7 illustrates manufacturing steps in the present modification example. A difference from the first embodiment is to use a method of performing pattern processing according to a photolithography method after a wiring material is deposited instead of using a damascene method in formation of the second wiring.

Steps up to deposition of the interlayer insulating film 22 in (b) of FIG. 4 (illustrated in (a) of FIG. 7) are the same as those in FIGS. 3 and 4. Thereafter, as illustrated in (b) of FIG. 7, a via hole 24a is opened. In the pixel region 1, the via hole 24a reaches the P contact film 15 of each micro-LED chip 100. In the common connection region 2, the via hole reaches the first wiring 21. In the division region 3, the via hole 24a reaches the first wiring 21 buried in the unit separation groove 16B, and a width thereof is preferably as wide as possible in a range of being smaller than a width of the first wiring 21.

Next, as illustrated in (c) of FIG. 7, a second wiring material 25a is deposited to be buried in the via hole 24a, and is processed into an electrode pattern. A P electrode 30a of each micro-LED chip 100 is formed in the pixel region 1, and an N electrode 31a is formed in the common connection region 2. In the division region 3, a separation groove portion second wiring 32a is formed. The second wiring material 25a may be a combination of, for example, a tungsten film and a barrier film; the via hole 24a may be temporarily buried with tungsten, and an aluminum alloy thin film may be deposited thereon to be processed through dry etching; and a second wiring may be formed by using a gold-based material according to a liftoff method.

Next, as illustrated in (d) of FIG. 7, the first wiring material 20a and the separation groove portion second wiring 32a in the division region 3 are removed. Preferably, a resist pattern exposing only the division region 3 is formed, and the first wiring material 20a and the separation groove portion second wiring 32a are dissolved to be removed through wet etching. Consequently, a unit separation groove 33a is formed in an outer periphery of the micro-LED unit 200. The subsequent steps are the same as those in (c) of FIG. 5 and the subsequent figures.

Also in the present modification example, in the same manner as in the first embodiment, in a micro-LED unit 200a, the P electrode 30 and the N electrode 31 can be respectively connected to the anode electrode 51 and the cathode electrode 52 of the drive circuit board 50 simultaneously through the connection step performed once. In the division region 3 outside the common connection region 2, the unit separation groove 33a is provided, and thus an irregular division shape that may occur when the micro-LED units 200a are divided from each other can be prevented, and an increase in a defect due to generation of dust can be prevented. Light output of the micro-LED chip 100a of the present modification example is the same as that of the micro-LED chip 100. Advantages of the present manufacturing steps are that it is not necessary to use a damascene method that is not spread in LED chip production in order to form a second wiring, and capital investment can be reduced by using a manufacturing equipment used for general LED chip production.

Second Modification Example of First Embodiment

Figure 8:
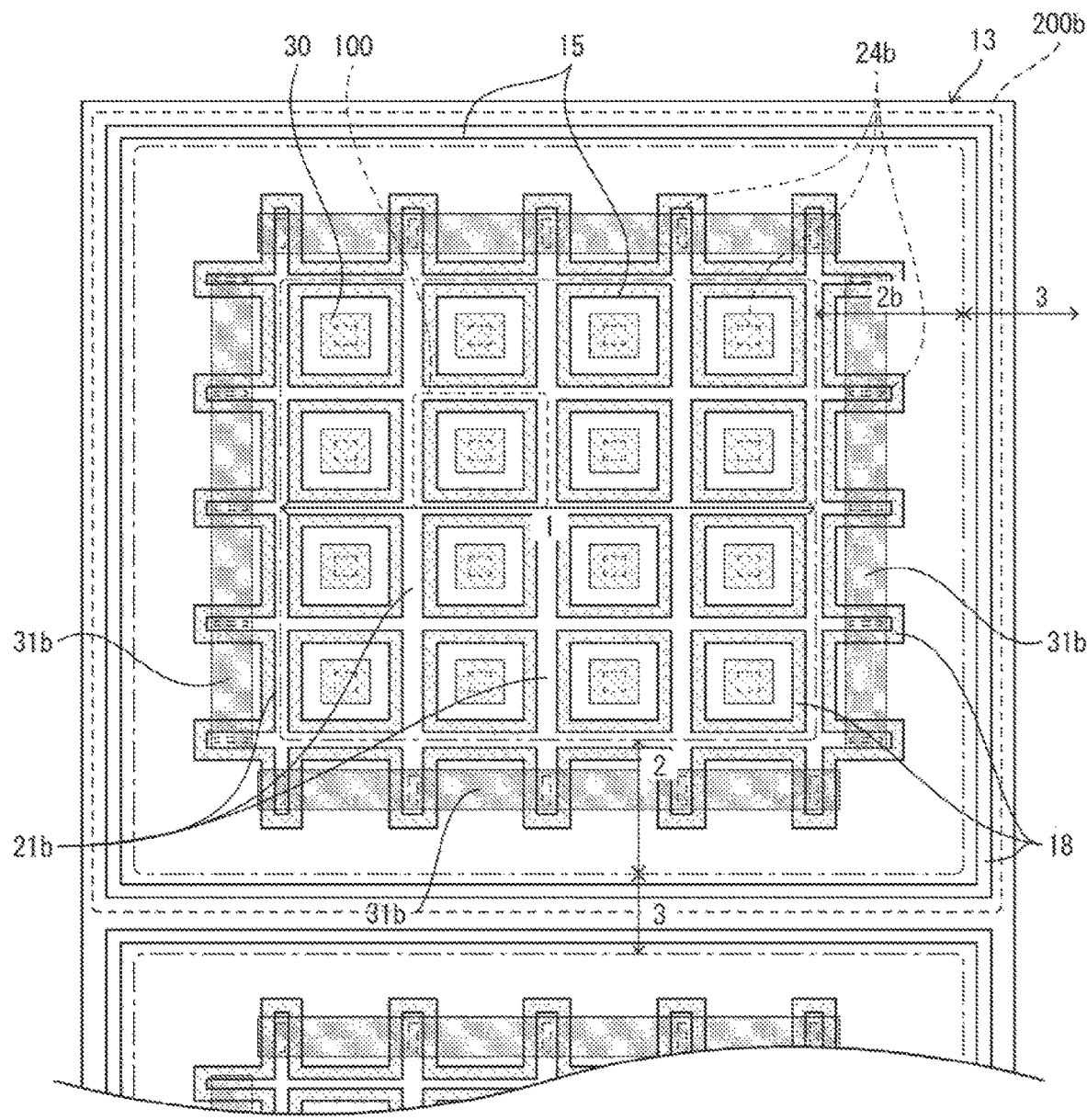
FIG. 8 is a schematic plan view in which an LED unit according to a second modification example of the first embodiment of the present invention is viewed from a light emission side.

The present modification example is the same as the first embodiment except a difference in a layout of the common connection region 2. The pixel region 1 or the division region 3 is not fundamentally changed. As illustrated in FIG. 8, in the micro-LED unit 200 in FIG. 2, among the first wirings 21, the wiring disposed in parallel to the outer periphery is deleted, a via hole 24b connecting an N electrode 31b to a first wiring 21b is disposed on the first wiring 21b extending to a common connection region 2b from the pixel region 1.

The same disposition may also be applied to a case where dummy chips are disposed around the pixel region 1, and the dummy chips or some thereof may be used as the common connection region 2b. None of the first wirings 21b extending from the pixel region 1 to the common connection region 2b are connected to the division region 3, and thus adverse influence on the first wiring 21b of the pixel region 1 is not exerted when the first wiring 21b of the unit separation groove 16B and the separation groove portion second wiring 32 are removed.

The layout has the same effect as in the first embodiment. There is an effect of reducing an area of the common connection region 2b, and thus there is an advantage that cost can be reduced by reducing an area of a micro-LED unit (LED unit) 200b.

Second Embodiment

In the first embodiment, the pixel separation groove 16 is extending to a part of the N-type layer 10, but the present embodiment is different from the first embodiment in that a pixel separation groove 16c is extending to a surface (a light emitting surface of a micro-LED chip (LED chip) 100c) of the growth substrate 9. Hereinafter, with reference to FIGS. 9 and 10, the present embodiment will be described through comparison with the first embodiment.

Figure 9:
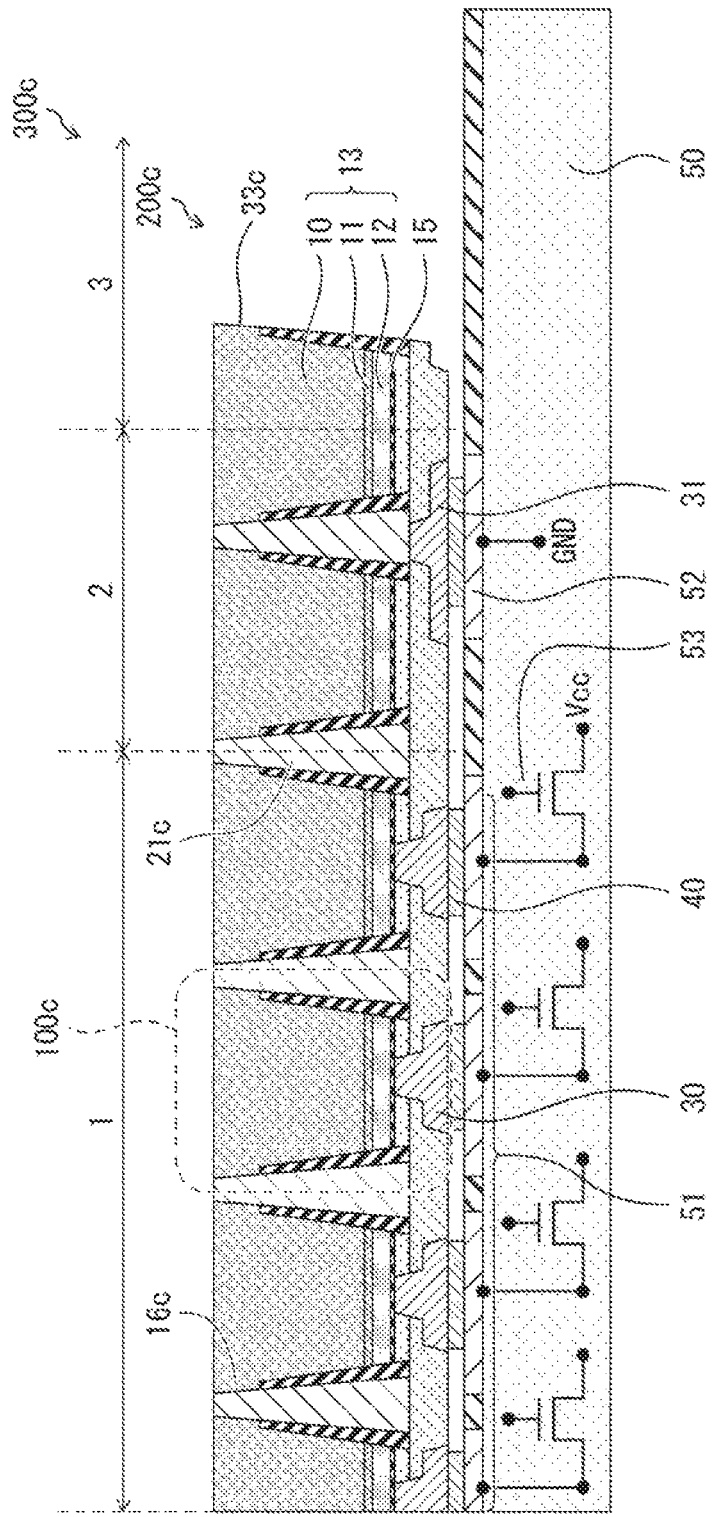
FIG. 9 is a schematic sectional view illustrating a structure of an image display element according to a second embodiment of the present invention.

As illustrated in FIG. 9, the pixel separation groove 16c reaches an end of the nitride semiconductor 13, and a first wiring 21c reaches up to the light emitting surface of the micro-LED chip 100c. In the division region 3, the end of the nitride semiconductor 13 matches a unit separation groove 33c, and thus the overhang shape in the first embodiment disappears. In this structure, each micro-LED chip 100c is completely covered with the first wiring 21c, and thus it is possible to substantially prevent leakage of light to the adjacent micro-LED chips. This has a great advantage that a problem such as color mixing or a reduction in contrast can be prevented in an image display element 300c. Since the overhang shape at the end of the micro-LED unit (LED unit) 200c disappears, there is an advantage that the generation of dust can be suppressed in a step such as unit division, unit bonding, or peeling-off of a growth substrate.

A manufacturing step of the present embodiment will be described with reference to FIG. 10. Steps up to (d) of FIG. 3 are the same as in the first embodiment. After (d) of FIG. 3 (illustrated in (a) of FIG. 10), as illustrated in (b) of FIG. 10, the nitride semiconductor 13 is etched again until the groove reaches the surface of the growth substrate 9. Next, as illustrated in (c) of FIG. 10 and (d) of FIG. 10, in the same manner as in FIGS. 3 to 6, the first wiring material 20 is deposited, and is polished by CMP such that the first wiring 21c is formed. The subsequent steps are the same as those in (b) of FIG. 4 and the subsequent figures.

Figure 10:
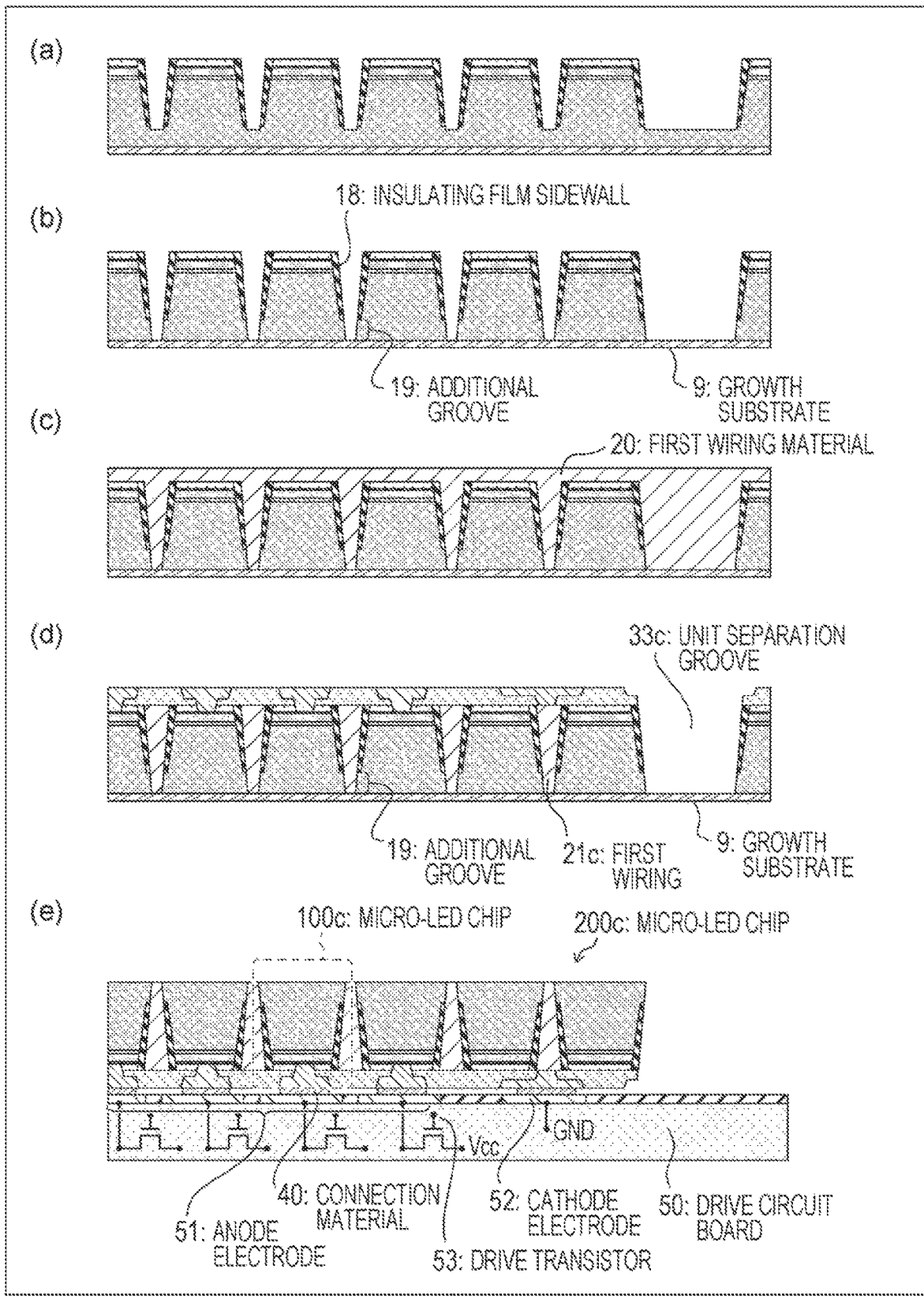
FIG. 10 is a schematic sectional view illustrating a step of manufacturing an LED unit and the image display element according to the second embodiment of the present invention.

Since a unit separation groove 33c reaches up to the growth substrate 9 in (d) of FIG. 10 after the separation groove portion second wiring 32 is removed in the same manner as in (b) of FIG. 5, the nitride semiconductor 13 is not divided and the generation of dust is prevented in unit division. Bonding with the drive circuit board 50 is the same as in the first embodiment. In the present embodiment, the first wiring 21c and the N-type layer 10 of the micro-LED chip 100c are electrically connected to each other at a sidewall part of an additional groove 19 that is formed through additional etching in (b) of FIG. 10.

As mentioned above, also in the present embodiment, in the same manner as in the first embodiment, in a micro-LED unit 200c, the P electrode 30 and the N electrode 31 can be respectively connected to the anode electrode 51 and the cathode electrode 52 of the drive circuit board 50 simultaneously through the connection step performed once. In the division region 3 outside the common connection region 2, the unit separation groove 33c is provided, and thus an irregular division shape that may occur when the micro-LED units 200b are divided from each other can be prevented, and an increase in a defect due to generation of dust can be prevented. The present embodiment has advantages that performance of an image display element 300c can be increased due to a simple change such as adding a step of etching the nitride semiconductor to the first embodiment, and the occurrence of a defect is suppressed such that a yield can be improved.

Third Embodiment

The present embodiment is different from the second embodiment in that the nitride semiconductor 13 of a micro-LED chip (LED chip) 100d has an inclined portion 27 around the light emitting layer 11. Remaining contents are the substantially same as those in the second embodiment.

Figure 11:
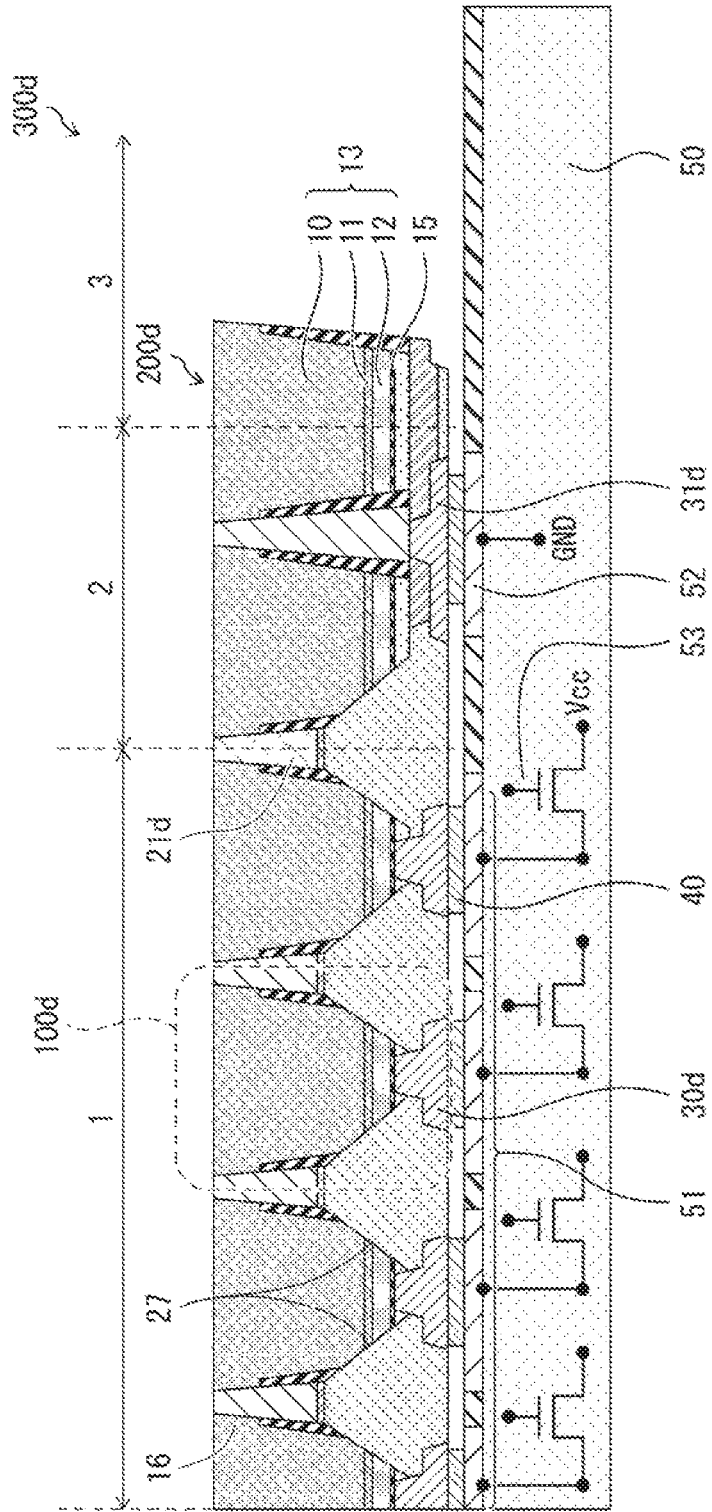
FIG. 11 is a schematic sectional view illustrating a structure of an image display element according to a third embodiment of the present invention.

As illustrated in FIG. 11, in the pixel region 1, a first wiring 21d is formed around only the bottom of the pixel separation groove 16, and a side surface of the nitride semiconductor 13 of the micro-LED chip 100d is covered with the inclined portion 27 around the light emitting layer 11. In other words, a side surface of the micro-LED chip 100d along a light emission direction around the light emitting layer 11 is inclined with respect to a plane along an extension direction of the light emitting layer 11 (inclined portion 27).

An advantage of this form using the inclined portion 27 is that light emitted in a horizontal direction to the drawing surface from the light emitting layer 11 is reflected upward by the inclined portion 27, and thus light extraction efficiency is considerably improved. In order to maximize the effect, all side surfaces of the micro-LED chip 100d are preferably formed of the inclined portion 27. As illustrated in FIG. 11, the inclined portion 27 is not necessarily provided in the common connection region 2 except the pixel separation groove 16 at a boundary with the pixel region 1. Also in the division region 3, in the same manner as in the common connection region 2, the inclined portion 27 is not necessarily provided.

The inclined portion 27 is most preferably inclined at about 45 degrees with respect to the plane formed by the light emitting layer 11, and is preferably inclined within a range from 30 degrees to 60 degrees when a manufacturing variation is taken into consideration, and is more preferably inclined within a range from 35 degrees to 55 degrees. A size of the inclined portion 27 is preferably large. This is because, as the size of the inclined portion 27 becomes larger, the light extraction efficiency of the micro-LED chip 100d is improved. However, the first wiring 21d is required to remain, and thus the inclined portion 27 cannot be extended to the bottom of a pixel separation groove 16d. In the pixel region 1, a P electrode 30d is required to be connected to the P-type layer 12 with a predetermined area, and thus the size of the inclined portion 27 is restricted.

Next, with reference to FIG. 12, a manufacturing step of the present embodiment will be described. Steps up to CMP of the first wiring material 20 in (c) of FIG. 10 (illustrated in (a) of FIG. 12) are the same as those in the second embodiment. Thereafter, as illustrated in (b) of FIG. 12, an upper part of the first wiring material 20 of the pixel region 1 is etched (first wiring recess etching) such that the first wiring material 20 remains on a lower part of the pixel separation groove 16, and the insulating film sidewall 18 is exposed over the upper part. Etching of the common wiring groove 16A in the common connection region 2 or the first wiring 21d of the unit separation groove 16B is not performed except the pixel separation groove 16 at the boundary with the pixel region 1. For example, in this step, a resist pattern having an opening placed in the pixel region 1 including the pixel separation groove 16 is formed and etched, and thus such a structure may be formed.

Figure 12:
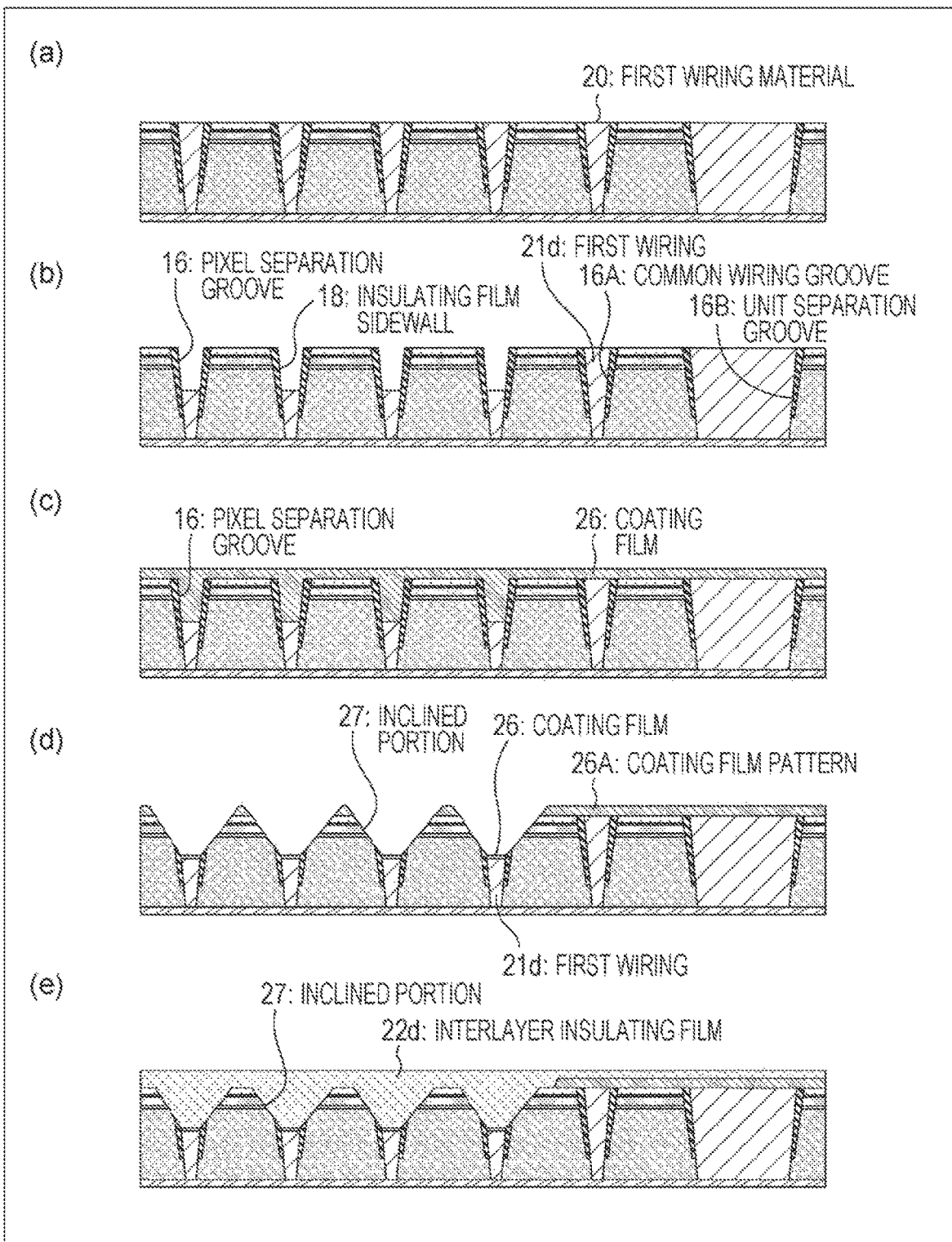
FIG. 12 is a schematic sectional view illustrating a step of manufacturing an LED unit and the image display element according to the third embodiment of the present invention.

Next, as illustrated in (c) of FIG. 12, a cover film 26 is deposited. In this case, the upper part of the pixel separation groove 16 exposed in (b) of FIG. 12 is buried with the cover film 26. The cover film 26 is an insulating film, and is preferably a CVD film made of, for example, $SiO_2$, SiN, SiON, or SiOCN.

Next, as illustrated in (d) of FIG. 12, a portion of the pixel separation groove 16 that is formed by subjecting the first wiring 21d to recess etching is subjected to taper etching, and thus the inclined portion 27 is formed. The taper etching may be realized by providing an inclination in a resist pattern that has an opening corresponding to the pixel separation groove 16 and covers the P-type layer 12 of the micro-LED chip 100d, etching the cover film 26 or the nitride semiconductor 13, and also shifting a pattern end by depleting the resist pattern.

The resist pattern does not have an opening corresponding to the common wiring groove 16A in the common connection region 2 or the unit separation groove 16B in the division region 3, and a cover film pattern 26A remains on this portion. A part of the cover film 26 preferably remains on the upper part of the first wiring 21d in the pixel separation groove 16 at the time of the inclined portion 27 being formed. In a case where the first wiring 21d is made of a copper-based material, when the first wiring 21d is exposed, copper is sputtered due to plasma during taper etching such that Cu is attached to the surface of the inclined portion 27 of the nitride semiconductor 13 and metal contamination is caused, and thus there is concern that light emission efficiency may be reduced. The cover film 26 is required to remain in order to prevent a constituent material of the first wiring 21d from exerting adverse influence on the nitride semiconductor 13.

Next, as illustrated in (e) of FIG. 12, an interlayer insulating film 22d is deposited on the entire surface formed as the inclined portion 27, and thus a surface is planarized. As illustrated in (a) of FIG. 13, in the same manner as in the second embodiment, a second wiring is formed, a P electrode 30d is formed on the micro-LED chip 100d, an N electrode 31d is formed in the common connection region 2, and a separation groove portion second wiring 32d is formed in the division region 3.

Figure 13:
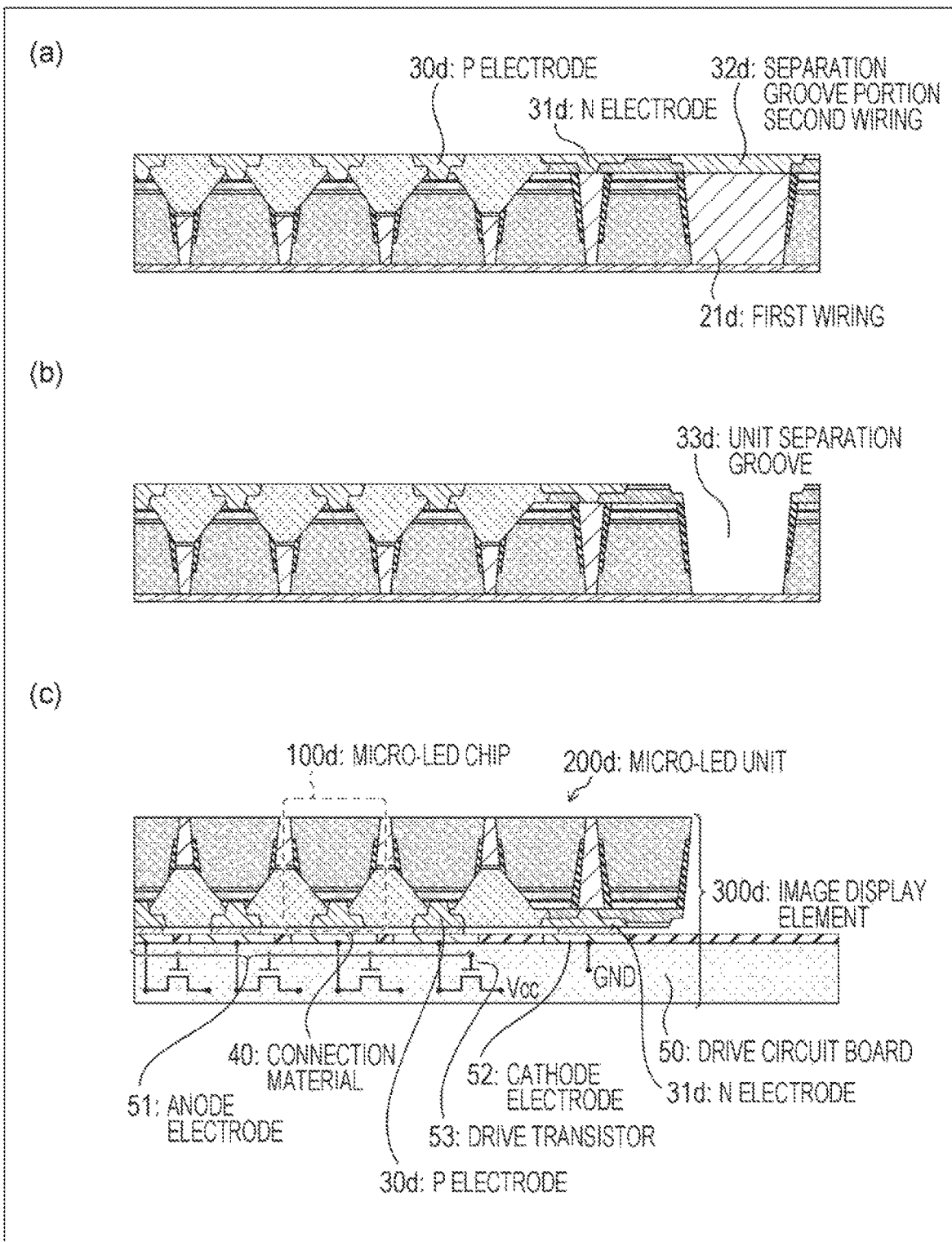
FIG. 13 is a schematic sectional view illustrating a subsequent step of manufacturing the LED unit and the image display element.

Next, as illustrated in (b) of FIG. 13, the first wiring 21d and the separation groove portion second wiring 32d of the division region 3 are removed through etching, and thus a unit separation groove 33d is opened. The subsequent steps are the same as those in (c) of FIG. 5 and the subsequent figures, and, as illustrated in (c) of FIG. 13, and a micro-LED unit 200d is connected to the drive circuit board 50 such that an image display element 300d is formed.

Also in the present embodiment, in the same manner as in the first embodiment, in the micro-LED unit 200d, the P electrode 30d and the N electrode 31d can be respectively connected to the anode electrode 51 and the cathode electrode 52 of the drive circuit board 50 simultaneously through the connection step performed once. In the division region 3 outside the common connection region 2, the unit separation groove 33d is provided, and thus an irregular division shape that may occur when the micro-LED units 200d are divided from each other can be prevented, and an increase in a defect due to generation of dust can be prevented. In this structure, light emission efficiency of the micro-LED chip 100d is considerably improved. In a case where there is no inclined portion 27, a plane size of the light emitting layer 11 of the micro-LED chip 100 was 7 μm square, a pixel separation groove width was 3 μm, the thickness Tp of the P-type layer 12 was 100 nm, the thickness Tmqw of the light emitting layer 11 was 70 nm, the thickness Tn of the N-type layer 10 was 6500 nm, a depth D of the pixel separation groove 16 was 4200 nm (only the nitride semiconductor 13), and an average thickness of the insulating film sidewall 18 was 500 nm.

In a case where the first wiring 21 was made of a copper-based material, the external quantum efficiency of the single micro-LED chip 100 was 11%. On the other hand, in a case where, as the inclined portion 27, an inclined surface was inclined at 45 degrees with respect to a plane formed by the light emitting layer 11, was extending to the surface of the P-type layer 12 from a location of a depth Dn=1500 nm from the light emitting layer 11 in the N-type layer 10, and was provided on four sides, light output of 210% was obtained at the same current compared with a structure not having the inclined portion 27. In other words, the external quantum efficiency was 23%.

The following factors are estimated to contribute to the remarkable increase in the light output. First, since the large inclined portion 27 is provided, and a thick and transparent material covers the inclined portion, light emitted from the light emitting layer 11 in the horizontal direction and toward the periphery thereof is totally reflected upward. The reflected light is incident to the surface of the N-type layer 10 at an incidence angle of about 0 degrees, and is emitted to the outside. In a case where the inclined portion 27 is not provided, the light is emitted in the horizontal direction to be absorbed by the peripheral metal layer or the like, or is repeatedly totally reflected in the nitride semiconductor 13 not to be emitted to the outside.

In contrast, in the present configuration, since light is totally reflected upward, loss of light does not occur much. Since light is incident to the surface of the N-type layer 10 at an incidence angle of about 0 degrees, transmittance is also high, and light extraction efficiency is very high. A thickness of the first wiring 21d is reduced to about 3.8 μm compared with a case where there is no inclined portion 27, but a significant problem cannot be found.

Fourth Embodiment

The present embodiment is the same as the third embodiment in that an inclined portion (inclination) 27e is provided in the nitride semiconductor 13 such that light output is improved, and is similar to the first embodiment or the second embodiment in terms of structure, and a manufacturing step is also simple.

Figure 14:
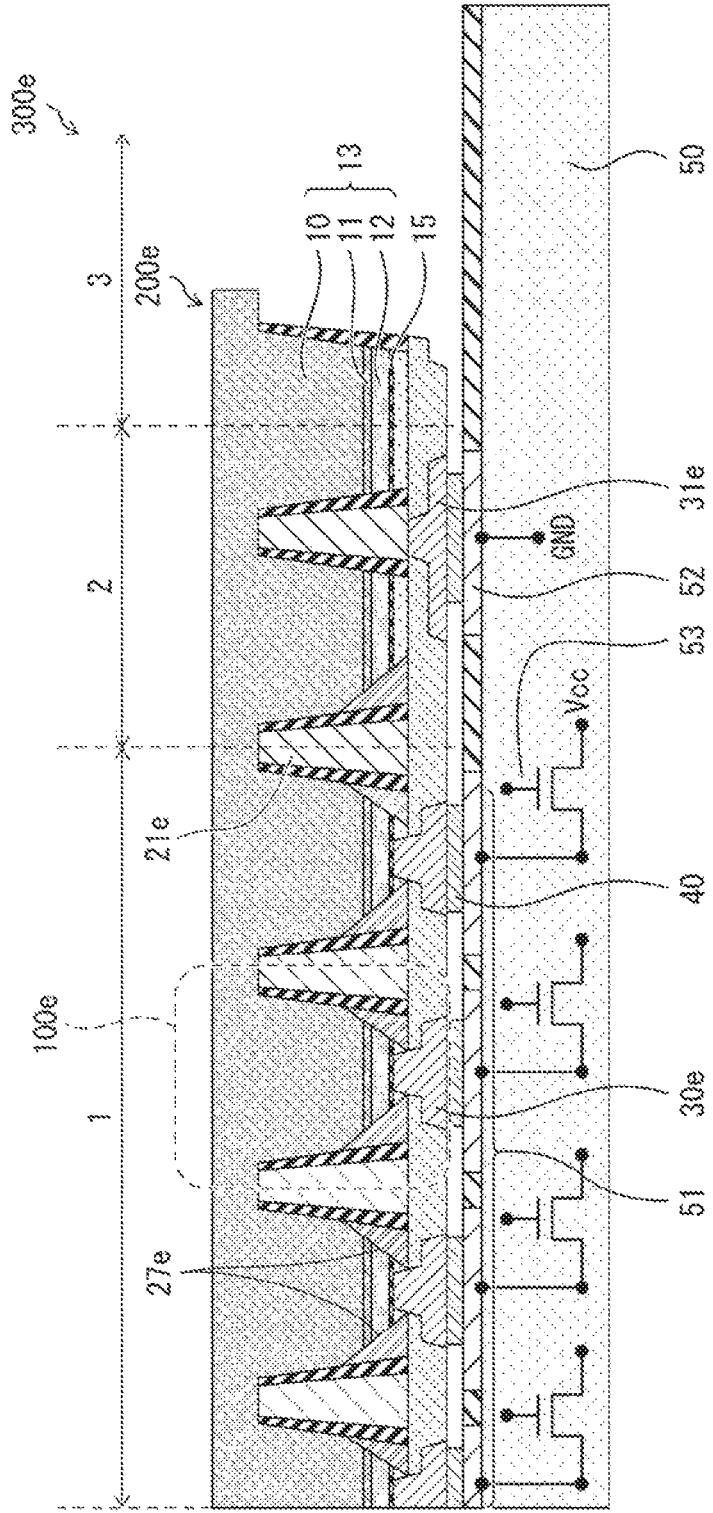
FIG. 14 is a schematic sectional view illustrating a structure of an image display element according to a fourth embodiment of the present invention.

As illustrated in FIG. 14, the same inclined portion 27e as in the third embodiment is provided in the nitride semiconductor 13. A difference from the third embodiment is that a first wiring 21e reaches up to the surface of the P-type layer 12 in the same manner as in the first embodiment or the second embodiment. In the present embodiment, a pixel separation groove 16e, the common wiring groove 16A, and the unit separation groove 33 do not penetrate through the N-type layer 10 in the same manner as in the first embodiment, but may penetrate through the N-type layer 10 in the same manner as in the second embodiment. The present embodiment has an advantage that a thickness of the first wiring 21e is not reduced, and resistance is not increased. Regarding a manufacturing step, the inclined portion 27e is formed before the first wiring 21e is formed, and thus there is an advantage that concern about contamination of the nitride semiconductor 13 due to a first wiring material is reduced.

A manufacturing method of the present embodiment will be described with reference to FIG. 15. First, as illustrated in (a) of FIG. 15, the nitride semiconductor 13, the P contact film 15, and the protection film 14 are formed, and, then, as illustrated in (b) of FIG. 15, the inclined portion 27e is formed at a location where the pixel separation groove 16e is scheduled to be formed. Performing taper etching by using a resist pattern is the same as in the method described in the third embodiment. The inclined portion 27e is not required to be formed at locations where the common wiring groove 16A and the unit separation groove 16B are scheduled to be formed. The inclined portion may be formed at the locations, but a description will be made of a case where the inclined portion is not provided.

Figure 15:
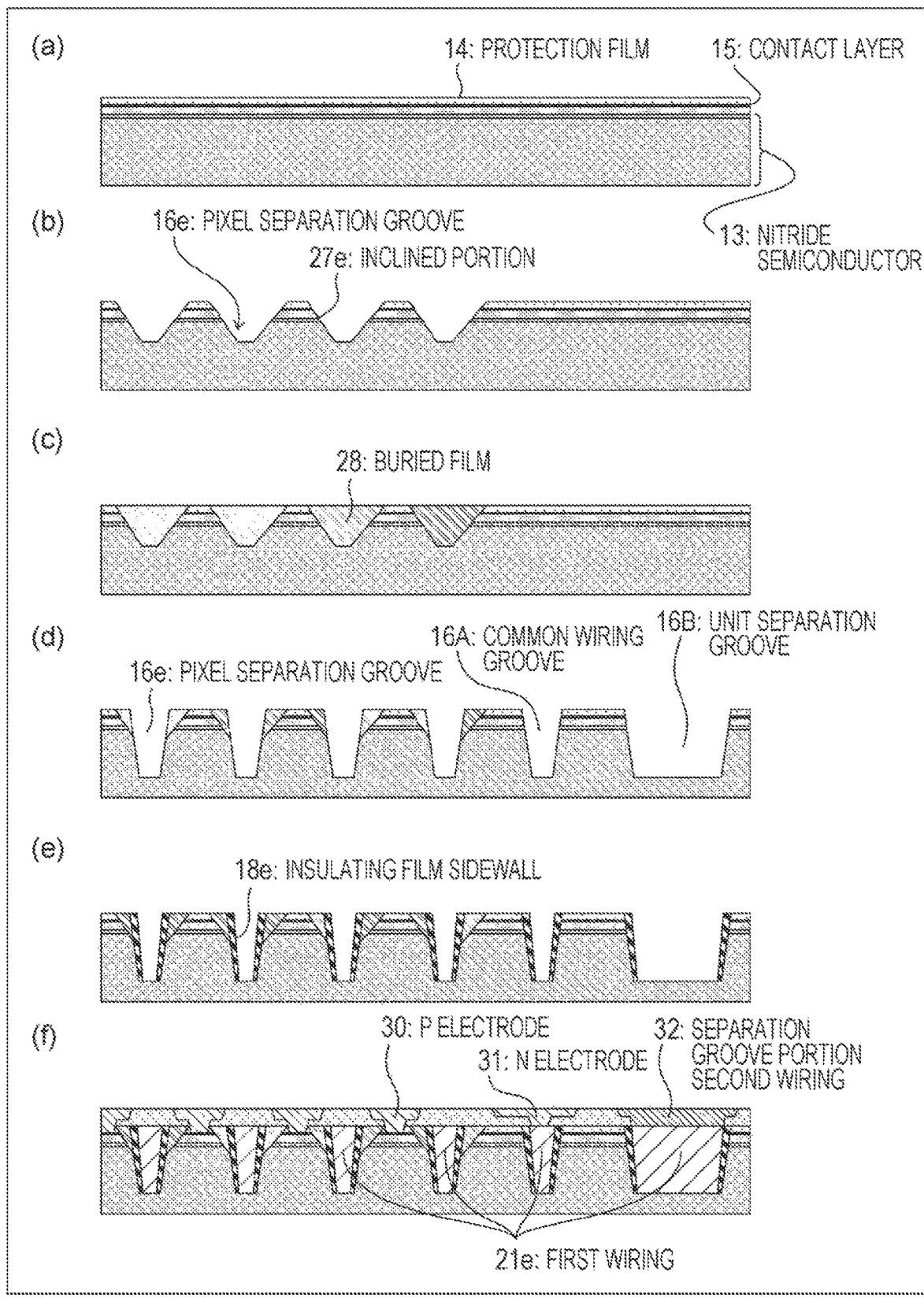
FIG. 15 is a schematic sectional view illustrating a step of manufacturing an LED unit and the image display element according to the fourth embodiment of the present invention.

Next, as illustrated in (c) of FIG. 15, an insulating film is deposited, a surface thereof is planarized by using a technique such as CMP, and thus a buried film 28 is formed. Preferably, a material of the buried film 28 is $SiO_2$, SiON, SiN, or SiOCN, and is formed of a transparent insulating film with respect to light emitted from the micro-LED chip 100d. A refractive index is preferably as low as possible with respect to the light, and $SiO_2$ is most preferably used.

Next, as illustrated in (d) of FIG. 15, the pixel separation groove 16e, the common wiring groove 16A, and the unit separation groove 16B are formed together. This is similar to (b) of FIG. 3. The subsequent steps are the same as those in (c) of FIG. 3 and the subsequent figures. (e) of FIG. 15 illustrates a state after an insulating film sidewall 18e is formed, and (f) of FIG. 15 illustrates a state after the P electrode 30, the N electrode 31, and a separation groove portion second wiring 32e using the first wiring 21e and a second wiring are formed. An image display element 300e formed after bonding to the drive circuit board 50 is as illustrated in FIG. 14.

Also in the present embodiment, in the same manner as in the first embodiment, in the micro-LED unit 200e, the P electrode 30 and the N electrode 31 can be respectively connected to the anode electrode 51 and the cathode electrode 52 of the drive circuit board 50 simultaneously through the connection step performed once. In the division region 3 outside the common connection region 2, the unit separation groove 33 is provided, and thus an irregular division shape that may occur when the micro-LED units 200e are divided from each other can be prevented, and an increase in a defect due to generation of dust can be prevented. A light output characteristic in the present embodiment is improved to two or more times in the same manner as in the third embodiment.

Modification Example of Fourth Embodiment

The present modification example is an example in which the manufacturing steps of the embodiment are simplified. Steps up to (d) of FIG. 15 (illustrated in (a) of FIG. 16) are the same as in FIG. 15. Thereafter, in the present modification example, as illustrated in (b) of FIG. 16, a first wiring 21f is directly formed without forming an insulating film sidewall 18e. A side surface around the light emitting layer 11 of the nitride semiconductor 13 is an inclined portion (inclination) 27f, and is covered with a buried film 28f that is an insulating film, and thus an insulating film sidewall is not necessarily required to be formed in terms of electrical characteristics. The subsequent steps may progress in the same manner as in the other embodiments, and the steps may progress to a final image display element 300f. In the present modification example, a step of forming an insulating film sidewall can be omitted, and thus there is an advantage that manufacturing steps can be reduced, and thus the number of manufacturing facilities can be reduced.

Also in the present modification example, in the same manner as in the first embodiment, in a micro-LED unit 200f, the P electrode 30 and the N electrode 31 can be respectively connected to the anode electrode 51 and the cathode electrode 52 of the drive circuit board 50 simultaneously through the connection step performed once. In the division region 3 outside the common connection region 2, the unit separation groove 33 is provided, and thus an irregular division shape that may occur when the micro-LED units 200f are divided from each other can be prevented, and an increase in a defect due to generation of dust can be prevented.

Light output can also be improved according to the structure and the manufacturing method of the present modification example, but the output is reduced by about 10% compared with the fourth embodiment. This may be because a major portion of the sidewall of the N-type layer 10 is in direct contact with the first wiring 21f, and thus the reflectance at the nitride semiconductor/metal interface is reduced. As mentioned above, the present modification example has an advantage that light output does not reach that in the fourth embodiment but is higher than in a structure not having an inclined portion, and manufacturing is simpler than in the fourth embodiment.

Fifth Embodiment

The present embodiment is different from the first embodiment in that a common connection region 2g is distributed dispersively in the pixel region 1. Remaining contents including management steps are the same as those in the first embodiment. The distributed disposition of the common connection region 2g in the pixel region 1 may be combined with the second to fourth embodiments. In addition to the distribution disposition, a common connection region may be provided in the outer periphery of the pixel region 1 in the same manner as in the first embodiment.

Figure 17:
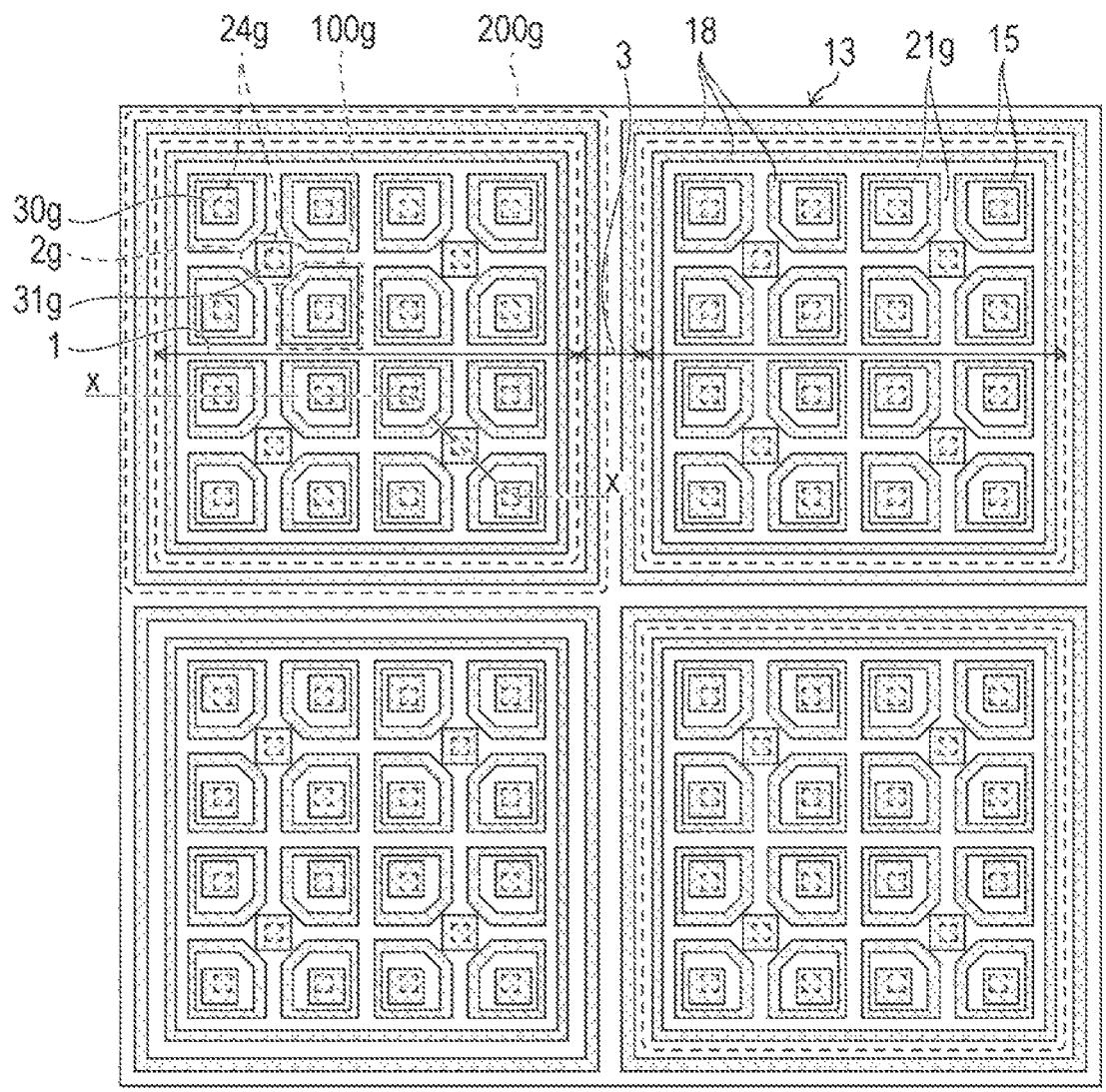
FIG. 17 is a schematic plan view in which an LED unit according to a fifth embodiment of the present invention is viewed from a light emission side.

As illustrated in FIG. 17, the common connection region 2g is surrounded by a plurality of micro-LED chips 100g, and is distributed dispersively in the pixel region 1. In the present embodiment, an N electrode 31g is disposed in the common connection region 2g provided in the pixel region 1. In this example, a single common connection region 2g is provided every micro-LED chips 100g of two rows and two columns. Therefore, the four micro-LED chips 100g share the single N electrode 31g.

Figure 18:
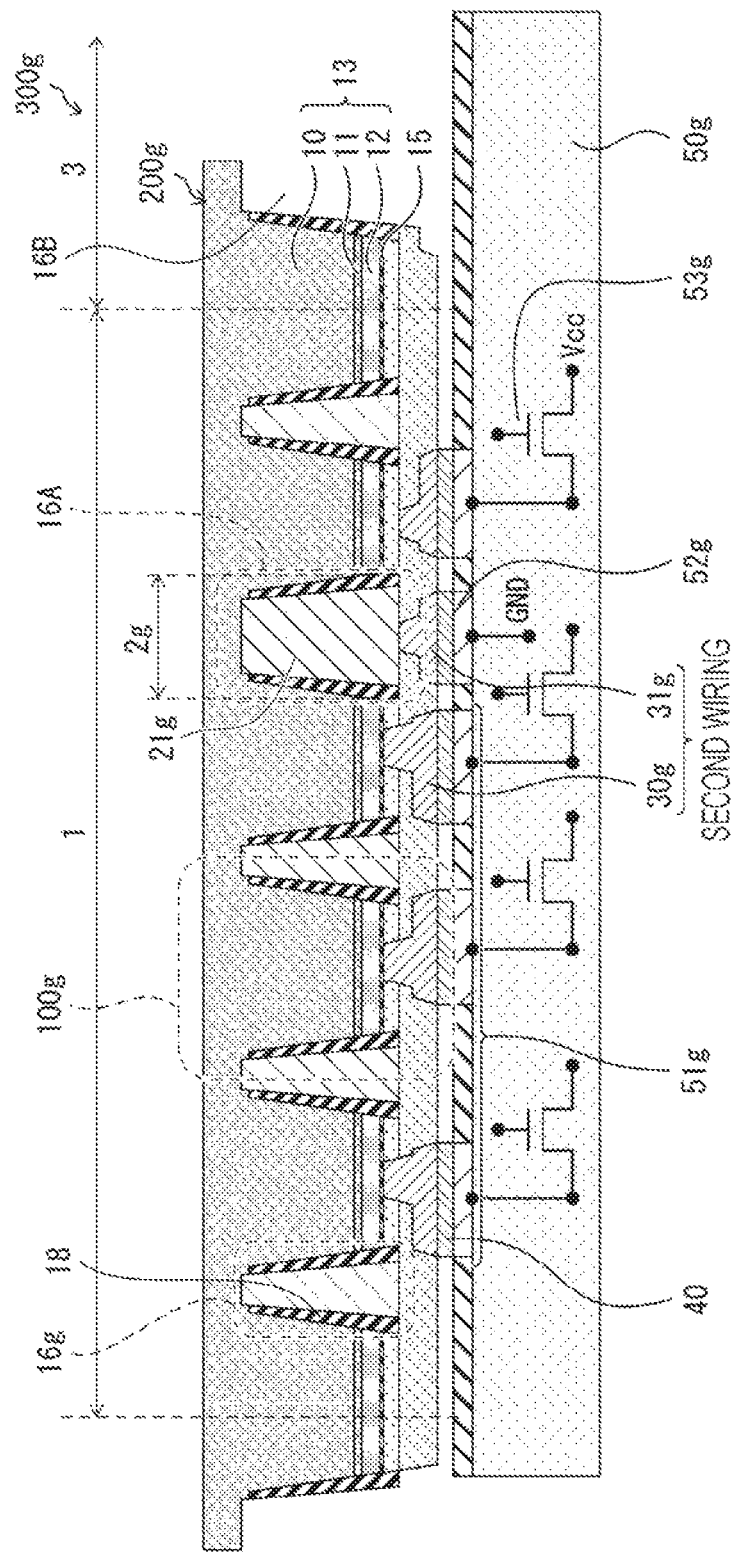
FIG. 18 is a schematic sectional view illustrating a structure of an image display element according to the fifth embodiment of the present invention.

FIG. 18 is a schematic sectional view illustrating an image display element 300g formed by bonding a micro-LED unit 200g of the present embodiment to a drive circuit board 50g. FIG. 18 is a sectional view corresponding to an X-X portion illustrated in FIG. 17. A width of a pixel separation groove 16g is increased in the portion of the common connection region 2g, but remaining contents thereof are the same as those in the first embodiment.

The micro-LED chip 100g has a planar shape in which a portion in contact with the common connection region 2g is depressed, and the rectangular shape in FIG. 2 is changed to a pentagonal shape in FIG. 17. In order to dispose the N electrode 31g, a P electrode 30g is disposed to be separated from the common connection region 2g. A size of a hole for use in connection to the N electrode 31g is increased in the pixel region 1, and thus a via hole 24g is not necessary outside the pixel region 1. None of the first wirings 21g are connected to the division region 3, and thus adverse influence on the first wiring 21g of the pixel region 1 is not exerted when the first wiring 21g of the unit separation groove 16B and the separation groove portion second wiring 32 are removed.

The drive circuit board 50g is not changed in terms of circuit although a disposition location of a cathode electrode 52g is greatly changed and a disposition location of an anode electrode 51g is slightly changed. In the present embodiment, a common connection region is not required to be provided on the periphery of the pixel region 1, and thus there is an advantage that an area of the micro-LED unit 200g can be reduced and thus cost can be reduced.

Also in the present embodiment, in the same manner as in the first embodiment, in a micro-LED unit 200g, the P electrode 30g and the N electrode 31g can be respectively connected to the anode electrode 51g and the cathode electrode 52g of the drive circuit board 50g simultaneously through the connection step performed once. In the division region 3 outside the pixel region 1, the unit separation groove 16B is provided, and thus an irregular division shape that may occur when the micro-LED units 200g are divided from each other can be prevented, and an increase in a defect due to generation of dust can be prevented. Cost can be reduced by reducing an area of the micro-LED unit 200g.

Sixth Embodiment

In the embodiments hitherto, the first wiring 21 in the pixel region 1 is disposed in each micro-LED chip. In other words, the first wiring is disposed on the entire outer periphery of the micro-LED chip. However, in the present embodiment, the first wiring is disposed every a plurality of micro-LED chips. Hereinafter, with reference to FIGS. 19 to 21, a description will be made through comparison with the fourth embodiment. Herein, a description will be made of an example in which a first wiring is disposed every two micro-LED chips in both of the vertical and the horizontal direction of the two-dimensional array, but the first wiring may be disposed every more micro-LED chips. A disposition pitch (the number of micro-LED chips interposed in the first wiring) of the first wiring in the vertical direction and the horizontal direction of the two-dimensional array may be changed.

Figure 19:
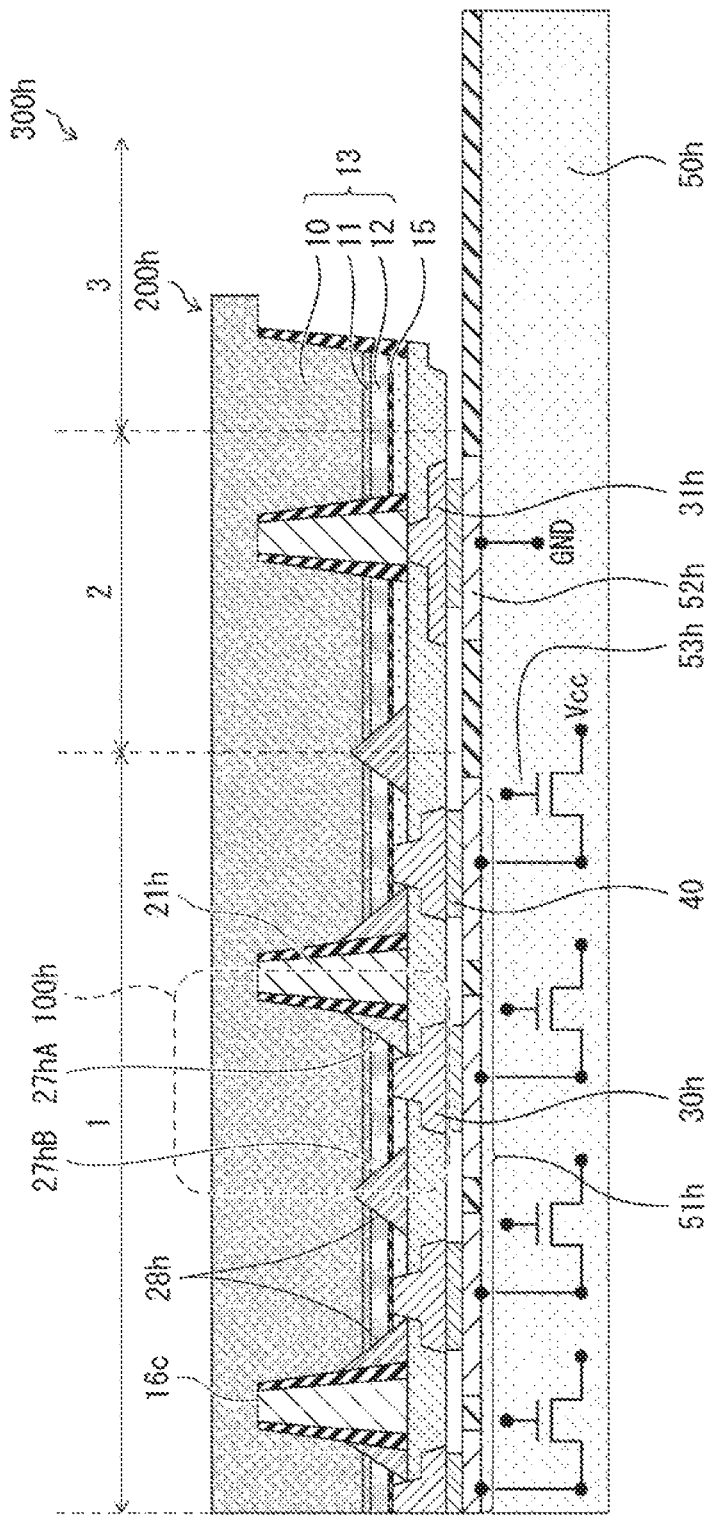
FIG. 19 is a schematic sectional view illustrating a structure of an image display element according to a sixth embodiment of the present invention.

FIG. 19 is a sectional view of an image display element 300h in which a micro-LED unit 200h is disposed on the drive circuit board 50 according to the present embodiment. In the present embodiment, the same inclined portion as in the fourth embodiment is also provided in the nitride semiconductor 13. A difference from the fourth embodiment is that a first wiring 21h is provided every two micro-LED chips 100h. An inclined portion A 27hA is provided at a location where the first wiring 21h is provided, and an inclined portion B 27hB is provided at a location where the first wiring 21h is not provided. A horizontal width (in other words, a distance between the micro-LED chips 100h with the inclined portion A 27hA interposed therebetween) Wa of the inclined portion A 27hA is larger than a width Wb (in other words, a distance between the micro-LED chips 100h with the inclined portion B 27hB interposed therebetween) of the inclined portion B 27hB such that a pixel separation groove 16h is provided. In other words, the horizontal width of the inclined portion B 27hB can be made smaller than that of the inclined portion A 27hA. As a result, in addition to the feature that the light output characteristic is improved in the fourth embodiment, an area of the light emitting layer 11 of the micro-LED chip 100h is larger than in the fourth embodiment such that the area of the light emitting layer 11 of the micro-LED chip 100h of the present embodiment is increased, and thus a current density per unit area can be reduced, so that there is an advantage that light emission efficiency can be further improved. In the present embodiment, the micro-LED chip 100h is in contact with the first wiring 21h on two sides, and an inclined portion 27hB buried with a buried film 28h is disposed on a side that is not in contact with the first wiring 21h. The micro-LED unit 200h is the same as in the fourth embodiment except the content, and the drive circuit board 50 is also the same as in the fourth embodiment.

Figure 20:
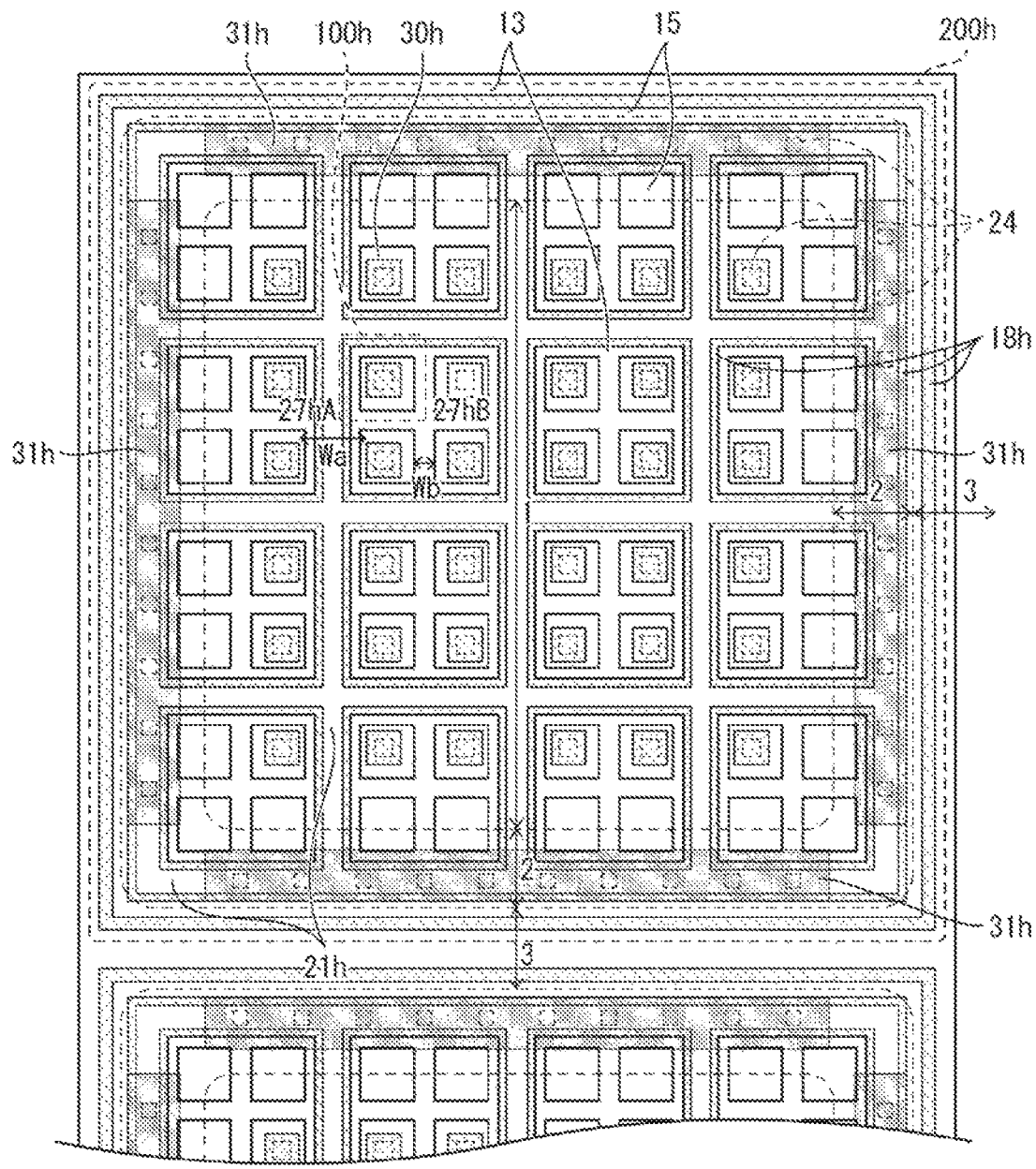
FIG. 20 is a schematic plan view in which an LED unit according to the sixth embodiment of the present invention is viewed from a light emission side.

FIG. 20 is a schematic plan view when the LED unit according to the sixth embodiment of the present invention is viewed from a light emission side. The first wiring 21h is provided every two micro-LED chips 100h in both of the vertical and the horizontal direction of the two-dimensional array, and thus the first wiring 21h surrounds the periphery of four micro-LED chips 100h. FIG. 20 illustrates a configuration in which the first wiring 21h is not disposed at an end of the pixel region 1, but there may be a configuration in which the first wiring 21h is disposed at the end of the pixel region 1. Since P electrodes 30h are disposed in a lattice form at an equal interval on the nitride semiconductor 13, the P electrodes 30h of the four micro-LED chips 100h surrounded by the first wiring 21h are disposed near corners of a square formed by the first wiring 21h.

In the same manner as in the third embodiment, in a case where the micro-LED chips 100h are disposed at an interval of 10 μm, a width of the pixel separation groove 16h is 3 μm, the depth Dn of the inclined portion from the light emitting layer 11 toward the N-type layer 10 side is 1.5 μm, and an inclined angle is 45 degrees, an average area of the light emitting layer 11 is about 4 μm×4 μm=16 μm² in the third embodiment. However, in the present embodiment, there is no groove on one side of the micro-LED chip 100h, and thus an area of the light emitting layer 11 can be increased to one side by 1.5 μm. Therefore, an area of the light emitting layer 11 in this case is 5.5 μm×5.5 μm=30 μm², and thus the area of the light emitting layer 11 becomes 1.89 times. Therefore, an electric density flowing through the light emitting layer is about 1/1.89 at an identical drive current. Typically, since light emission efficiency is reduced in a nitride semiconductor LED when an electric density increases (this phenomenon is called a droop effect), the electric density is reduced, and thus the light emission efficiency can be expected to be improved.

A manufacturing method of the present invention will be described with reference to FIG. 21. First, as illustrated in (a) of FIG. 3, the nitride semiconductor 13, the P contact film 15, and the protection film 14 are formed, and, then, as illustrated in (a) of FIG. 21, the inclined portion A 27hA and the inclined portion B 27hB are alternately formed at ends of the micro-LED unit 100h. Performing taper etching by using a resist pattern is the same as in the method described in the third embodiment.

Next, as illustrated in (b) of FIG. 21, the insulating film 17 is deposited, a surface thereof is planarized by using a technique such as CMP, and thus a buried film 28h is formed. Preferably, a material of the buried film 28h is $SiO_2$, SiON, SiN, or SiOCN, and is formed of a transparent insulating film with respect to light emitted from the micro-LED chip 100h. A refractive index is preferably as low as possible with respect to light emitted from the micro-LED chip 100h, and $SiO_2$ is most preferably used.

Next, as illustrated in (c) of FIG. 21, the pixel separation groove 16h, the common wiring groove 16A, and the unit separation groove 16B are formed together (accurately, the pixel separation groove 16h does not separate the pixels from each other, but is used as it is for the purpose of matching with the terms in the other embodiments). This is the same as in (b) of FIG. 3. The pixel separation groove 16h is the same as in the fourth embodiment except that the pixel separation groove is formed for only the inclined portion A 27hA and is not formed for the inclined portion B 27hB. The subsequent steps are the same as those in (d) of FIG. 15 and the subsequent figures. Thus, an insulating film sidewall 18h is formed as illustrated in (d) of FIG. 21, and then a P electrode 30h, an N electrode 31h, and a separation groove portion second wiring 32h using the first wiring 21h and a second wiring are formed as illustrated in (e) of FIG. 21. An image display element 300h formed after bonding to the drive circuit board 50 is as illustrated in FIG. 19.

Also in the present embodiment, in the same manner as in the first embodiment, in the micro-LED unit 200h, the P electrode 30h and the N electrode 31h can be respectively connected to the anode electrode 51 and the cathode electrode of the drive board 50 simultaneously through the connection step performed once. In the division region 3 outside the common connection region 2, the unit division groove 33 is provided, and thus an irregular division shape that may occur when the micro-LED units 200h are divided from each other can be prevented, and an increase in a defect due to generation of dust can be prevented. A light output characteristic in the present embodiment is improved by 8% compared with the fourth embodiment. This may be because an area of the light emitting layer 11 is increased such that a current density is reduced, and thus a droop effect is weakened.

SUMMARY

An LED unit related to Aspect 1 of the present invention includes: a plurality of LED chips each having a nitride semiconductor in which an N-type layer, a light emitting layer, and a P-type layer are laminated in this order in a pixel region; a first wiring that is disposed inside a groove formed in the nitride semiconductor to penetrate between the N-type layer and the P-type layer and is electrically connected to the N-type layer; and a second wiring that includes a P electrode connected to the P-type layer and an N electrode connected to the first wiring, in which the N electrode and the P electrode are formed on the same surface.

According to the configuration, the N electrode and the P electrode are formed on the same surface. Thus, the N electrode and the P electrode can be respectively bonded to a cathode electrode and an anode electrode of a drive circuit board through a connection step performed once.

According to the LED unit related to Aspect 2 of the present invention, in the above Aspect 1, preferably, a division region used to sever the LED unit from another LED unit is provided in an outer periphery of the LED unit, a unit separation groove used to separate the LED unit from another LED unit is provided in the division region, and the first wiring is not present inside the unit separation groove.

According to the configuration, since the unit separation groove is formed in the division region, it is possible to prevent an edge of the LED unit from being split in an irregular shape when each LED unit is fragmented and to suppress the occurrence of defects in a bonding process to the drive circuit board or in the subsequent manufacturing processes. According to the configuration, since the first wiring is not present inside the unit separation groove, it is possible to suppress that a first wiring material scatters to increase dust and thus a defect increases in a step of dividing the LED units or a step of bonding to the drive circuit board.

According to the LED unit related to Aspect 3 of the present invention, in the above Aspect 2, preferably, the first wiring and the second wiring are not present in the division region. According to the configuration, since the first wiring and the second wiring are not present in the division region, it is possible to prevent an increase in a defect due to the generation of dust that may be generated when the LED units are divided from each other.

According to the LED unit related to Aspect 4 of the present invention, in the above Aspect 2 or 3, the N electrode may be disposed in a common connection region provided between the pixel region and the division region.

According to the LED unit related to Aspect 5 of the present invention, in the above Aspect 4, the N electrode may be disposed along four sides of the pixel region having a substantially rectangular shape. According to the configuration, it is possible to improve the uniformity of luminance and thus to reduce power consumption by reducing a variation in luminance due to resistance of a wiring from the N electrode to the LED chip in the pixel region.

According to the LED unit related to Aspect 6 of the present invention, in any one of the above Aspects 1 to 3, the N electrode may be disposed in a common connection region provided inside the pixel region. According to the configuration, the common connection region is not required to be provided on the periphery of the pixel region, and therefore it is possible to reduce an area of the LED unit and thus to reduce cost.

According to the LED unit related to Aspect 7 of the present invention, in any one of the above Aspects 1 to 6, the first wiring may reach up to a light emitting surface of the LED chip. According to the configuration, the LED chip is completely covered with the first wiring, and thus it is possible to substantially prevent leakage of light to adjacent LED chips. Consequently, it is possible to solve a problem such as color mixing and thus to suppress a reduction in contrast.

According to the LED unit related to Aspect 8 of the present invention, in any one of the above Aspects 1 to 7, preferably, a side surface of the LED chip along a light emission direction around the light emitting layer is inclined in a range from 30 degrees to 60 degrees with respect to a plane along an extension direction of the light emitting layer. According to the configuration, light emitted from the light emitting layer in parallel to the light emitting surface is reflected in the light emission direction due to an inclination, and thus light extraction efficiency is considerably improved.

According to the LED unit related to Aspect 9 of the present invention, in any one of the above Aspects 1 to 8, preferably, the first wiring contains aluminum or silver. According to the configuration, it is possible to increase light emission efficiency of the LED unit.

According to the LED unit related to Aspect 10 of the present invention, in any one of the above Aspects 1 to 9, preferably, a contact layer is formed in contact with the P-type layer, and the contact layer includes a transparent conductive film, or contains aluminum or silver. According to the configuration, it is possible to reduce contact resistance of the contact layer with the P-type layer and thus to increase light reflectance at an interface with the nitride semiconductor.

According to the LED unit related to Aspect 11 of the present invention, preferably, the first wiring is disposed to surround the plurality of LED chips. According to the configuration, it is possible to increase an area of the light emitting layer of the LED unit and thus to increase light emission efficiency.

According to the LED unit related to Aspect 12 of the present invention, preferably, the N electrode and the P electrode are formed on a surface of the nitride semiconductor facing a surface of a drive circuit board on which a cathode electrode and an anode electrode are provided. According to the configuration, the N electrode and the P electrode can be respectively connected to the cathode electrode and the anode electrode of the drive circuit board through bonding to the drive circuit board according to a simple method.

According to an image display element related to Aspect 13 of the present invention, the LED unit in any one of the above Aspects 1 to 12 is stacked on the drive circuit board. According to the configuration, the same effect as in the above Aspect 1 can be achieved.

A method of manufacturing an LED unit related to Aspect 14 of the present invention is a method of manufacturing the LED unit according to any one of the above Aspects 1 to 11, the method preferably including a step of depositing the N-type layer, the light emitting layer, and the P-type layer formed by the nitride semiconductor in this order on a growth substrate; a step of forming the groove by etching the nitride semiconductor; a step of forming the first wiring inside the groove; a step of forming the second wiring on a surface of the nitride semiconductor; and a step of removing the first wiring and the second wiring in a unit separation groove surrounding an outer periphery of the LED unit. According to the method, it is possible to prevent an increase in a defect due to the generation of dust that may be generated when the LED units are divided from each other.

A method of manufacturing an image display element related to Aspect 15 of the present invention is a method of manufacturing the image display element according to the above Aspect 13, the method preferably including a step of depositing the N-type layer, the light emitting layer, and the P-type layer formed by the nitride semiconductor in this order on a growth substrate; a step of forming the groove by etching the nitride semiconductor; a step of forming the first wiring inside the groove; a step of forming the second wiring on a surface of the nitride semiconductor; a step of removing the first wiring and the second wiring in a unit separation groove surrounding an outer periphery of the LED unit; a step of dividing the LED units from each other; a step of bonding the divided LED unit to the drive circuit board; and a step of peeling off the growth substrate.

According to the method, since the unit separation groove is formed to surround the outer periphery of the LED unit, it is possible to prevent an edge of the LED unit from being split in an irregular shape when each LED unit is fragmented and to suppress the occurrence of defects in a step of joint to the drive circuit board or in the subsequent manufacturing processes. According to the method, it is possible to prevent an increase in a defect due to the generation of dust that may be generated when the LED units are divided from each other.

A method of manufacturing an image display element related to Aspect 16 of the present invention is a method of manufacturing the image display element according to the above Aspect 13, the method including a step of depositing the N-type layer, the light emitting layer, and the P-type layer formed by the nitride semiconductor in this order on a growth substrate; a step of forming the groove by etching the nitride semiconductor; a step of forming the first wiring inside the groove; a step of forming the second wiring on a surface of the nitride semiconductor; a step of removing the first wiring and the second wiring in a unit separation groove surrounding an outer periphery of the LED unit; a step of dividing the LED units from each other; a step of bonding the divided LED unit to the drive circuit board; and a step of peeling off the growth substrate, in which the respective steps may be performed in the above order. According to the method, the same effect as in the above Aspect 14 can be achieved.

[Appendix]

The present invention is not limited to the above-described respective embodiments, various changes may occur within the scope disclosed in the claims, and embodiments obtained through appropriate combination of technical means disclosed in different embodiments are also included in the technical scope of the present invention. A novel technical feature may be formed by combining technical means disclosed in the respective embodiments with each other. The present invention is useful for, for example, a projector, a head-up display, a head mounted display, or a wearable terminal.

REFERENCE SIGNS LIST

1 PIXEL REGION
2 COMMON CONNECTION REGION
3 DIVISION REGION
9 GROWTH SUBSTRATE
10 N-TYPE LAYER
11 LIGHT EMITTING LAYER
12 P-TYPE LAYER
13 NITRIDE SEMICONDUCTOR
15 P CONTACT FILM (CONTACT LAYER)
16 PIXEL SEPARATION GROOVE (GROOVE)
16B UNIT SEPARATION GROOVE
21, 21b to 21g FIRST WIRING
27, 27d INCLINED PORTION (INCLINATION)
30, 30a, 30d, 30g, 30h P ELECTRODE
31, 31a, 31b, 31d, 31g, 31h N ELECTRODE
33, 33a, 33c, 33d UNIT SEPARATION GROOVE
50, 50g DRIVE CIRCUIT BOARD
51, 51g ANODE ELECTRODE
52, 52g CATHODE ELECTRODE
100, 100a TO 100h MICRO-LED CHIP (LED CHIP)
200, 200a TO 200h MICRO-LED UNIT (LED UNIT)
300, 300c TO 300h IMAGE DISPLAY ELEMENT

The invention claimed is:

1. An LED unit comprising:
   a plurality of micro-LED chips each having a nitride semiconductor in which an N-type layer, a light emitting layer, and a P-type layer are laminated in this order in a pixel region and further having a P electrode, the plurality of micro-LED chips sharing an N electrode, and the LED unit having a common connection region in which the N electrode is disposed;
   first wiring that is disposed inside a groove formed in the nitride semiconductor to penetrate between the N-type layer and the P-type layer and is electrically connected to the N-type layer; and
   second wiring that forms a P electrode connected to the P-type layer and an N electrode connected to the first wiring,
   wherein:
   the N electrode and the P electrode are formed on a same surface;
   a surface of the first wiring that is at a side of the same surface on which the N electrode and the P electrode are formed is covered with an insulating layer; and
   the first wiring and the N electrode are connected to each other only in the common connection region.

2. The LED unit according to claim 1, wherein:
   a division region used to sever the LED unit from another LED unit is provided in an outer periphery of the LED unit;
   a unit separation groove used to separate the LED unit from another LED unit is formed in the division region;
   the unit separation groove is separated from the groove in which the first wiring is disposed and has a width of 10 μm or more and 30 μm or less; and
   wherein the first wiring is not present inside the unit separation groove.

3. The LED unit according to claim 2, wherein the first wiring and the second wiring are not present in the division region.

4. The LED unit according to claim 2, wherein:
   the common connection region is provided around the pixel region; and
   the N electrode covers the P-type layer and the groove in the common connection region.

5. The LED unit according to claim 4, wherein:
   the N electrode is divided along four sides of the pixel region having a substantially rectangular shape; and
   a length of the N electrode in a side direction is larger than a length corresponding to at least two micro-LED chips.

6. The LED unit according to claim 1, wherein the N electrode is disposed in a common connection region provided inside the pixel region, and one N electrode is shared by four micro-LED chips and is disposed at an equal distance from the four micro-LED chips.

7. The LED unit according to claim 1,
   wherein the first wiring reaches up to a light emitting surface of the micro-LED chip, and
   wherein the first wiring and the N-type layer are in electrical contact with each other at a sidewall of the groove.

8. The LED unit according to claim 1, wherein:
   an inclined portion of the micro-LED chip along a light emission direction around the light emitting layer is inclined from 35 degrees to 55 degrees with respect to a plane along an extension direction of the light emitting layer; and
   a side surface of the groove on which the first wiring is formed is inclined at an angle greater than 70 degrees.

9. The LED unit according to claim 8, wherein the first wiring penetrates a transparent insulating film covering the inclined portion.

10. The LED unit according to claim 8, wherein the inclined portion is covered with a transparent insulating film, and the first wiring covers an outside of the transparent insulating film.

11. The LED unit according to claim 8, wherein an insulating film is formed between the first wiring formed inside the groove and the N-type layer.

12. The LED unit according to claim 8, wherein the first wiring formed inside the groove is in direct contact with the N-type layer.

13. The LED unit according to claim 8, wherein a metal electrode is arranged in contact with a surface of the P-type layer.

14. The LED unit according to claim 8, wherein the first wiring extends to a light emitting surface of each of the plurality of micro-LED chips.

15. The LED unit according to claim 1, wherein the first wiring is disposed to surround a perimeter of the plurality of micro-LED chips.

16. An image display element comprising a drive circuit board provided with a circuit which supplies a current causing each of a plurality of micro-LED chips to emit light; and
   the LED unit according to claim 1 stacked on the drive circuit board,
   wherein:
   an anode electrode on the drive circuit board is connected to the P electrode; and
   a cathode electrode on the drive circuit board is connected to the N electrode.

17. The LED unit according to claim 1, wherein:
   the first wiring is entirely covered by the insulating layer; and
   a length of the N electrode is larger than a width of the groove.

18. The LED unit according to claim 1, wherein a side surface of the groove is inclined at an angle greater than 70 degrees with respect to a plane along an extending direction of the light emitting layer;
   the side surface is covered with an insulating film; and
   the first wiring covers an outside of the insulating film.

19. The LED unit according to claim 18, wherein a metal electrode is disposed on a surface of the P-type layer.

20. The LED unit according to claim 18, wherein the first wiring extends a light emitting surface of each of the plurality of micro-LED chips.

* * * * *